United States Patent
Hirzel et al.

(10) Patent No.: US 9,569,418 B2
(45) Date of Patent: Feb. 14, 2017

(54) STREAM-ENABLED SPREADSHEET AS A CIRCUIT

(71) Applicant: International Business Machines Corporation, Armonk, NY (US)

(72) Inventors: Martin J. Hirzel, Ossining, NY (US); Rodric Rabbah, Somers, NY (US); Philippe Suter, New York, NY (US); Olivier L. J. Tardieu, White Plains, NY (US); Mandana Vaziri, White Plains, NY (US)

(73) Assignee: International Busines Machines Corporation, Armonk, NY (US)

( * ) Notice: Subject to any disclaimer, the term of this patent is extended or adjusted under 35 U.S.C. 154(b) by 250 days.

(21) Appl. No.: 14/317,699

(22) Filed: Jun. 27, 2014

(65) Prior Publication Data
US 2015/0378979 A1    Dec. 31, 2015

(51) Int. Cl.
| G06F 17/00 | (2006.01) |
| G06F 17/24 | (2006.01) |
| G06F 17/50 | (2006.01) |

(52) U.S. Cl.
CPC ......... G06F 17/246 (2013.01); G06F 17/5045 (2013.01)

(58) Field of Classification Search
CPC .................................................. G06F 17/246
See application file for complete search history.

(56) References Cited

U.S. PATENT DOCUMENTS

| 5,819,102 A * | 10/1998 | Reed ................. G06F 17/10 708/490 |
| 6,490,600 B1 * | 12/2002 | McGarry ............ G06F 17/246 345/505 |
| 8,082,489 B2 * | 12/2011 | Jiang .................. G06F 17/2247 715/212 |
| 8,386,633 B2 * | 2/2013 | Smith ................. G06Q 40/00 705/36 R |
| 9,268,748 B2 * | 2/2016 | Davis ................. G06F 17/218 |
| 9,286,285 B1 * | 3/2016 | Vagell ................ G06F 17/246 |
| 2006/0112123 A1 * | 5/2006 | Clark ................ G06F 17/246 |
| 2006/0136534 A1 * | 6/2006 | Boon ................. G06F 17/246 708/200 |

(Continued)

OTHER PUBLICATIONS

Ali et al., "The Extensibility Framework in Microsoft StreamInsight", ICDE Conference 2011, pp. 1242-1253, © 2011 IEEE.

(Continued)

*Primary Examiner* — Laurie Ries
(74) *Attorney, Agent, or Firm* — David B. Woycechowsky

(57) ABSTRACT

Converting data transformations entered in a spreadsheet program into a circuit representation of those transformations. The circuit representation can run independently of the spreadsheet program to transform input data into output data. In some cases the circuit representation is in the form of hardware, accepts and/or produces data streams, and/or the circuit and/or output data or data streams can be shared among multiple users and/or subscribers. Where data streams are processed, the transformations may include well-specified timing semantics, supporting operations that involve rate-based rate manipulation, value-based rate manipulation, and/or access to past cell values.

6 Claims, 14 Drawing Sheets

(56) References Cited

U.S. PATENT DOCUMENTS

| | | | |
|---|---|---|---|
| 2007/0233811 A1* | 10/2007 | Rochelle | G06F 17/246 709/219 |
| 2008/0016436 A1* | 1/2008 | Liu | H04L 67/34 715/212 |
| 2008/0046983 A1* | 2/2008 | Lester | G06F 21/31 726/5 |
| 2009/0012842 A1* | 1/2009 | Srinivasan | G06F 17/30684 705/12 |
| 2009/0112937 A1* | 4/2009 | Campbell | G06F 17/246 |
| 2009/0113284 A1* | 4/2009 | Kulkarni | G06F 17/246 715/219 |
| 2009/0171999 A1* | 7/2009 | McColl | G06F 17/30539 |
| 2011/0016379 A1 | 1/2011 | McColl et al. | |
| 2011/0225484 A1* | 9/2011 | Lotan-Bolotnikoff | G06F 8/35 715/212 |
| 2012/0110428 A1* | 5/2012 | Meijer | G06F 9/46 715/219 |
| 2012/0137203 A1* | 5/2012 | Schodl | G06F 17/246 715/215 |
| 2012/0330995 A1* | 12/2012 | Muenkel | G06F 17/30424 707/769 |
| 2013/0205200 A1* | 8/2013 | Lazarevic | G06K 9/00463 715/244 |
| 2014/0149838 A1* | 5/2014 | Bedard | G06F 17/246 715/217 |
| 2015/0082224 A1* | 3/2015 | Hathaway | G06F 9/44 715/771 |
| 2015/0254226 A1* | 9/2015 | Renshaw | G06F 17/246 715/219 |

OTHER PUBLICATIONS

Amadio et al., "Reactive concurrent programming revisited", Jul. 28, 2013, pp. 1-14.

Arasu et al., "The CQL continuous query language: semantic foundations and query execution", The VLDB Journal (2006) 15(2): pp. 121-142, DOI 10.1007/s00778-004-0147-z, Received: Jun. 7, 2004 / Accepted: Nov. 22, 2004 / Published online: Jul. 22, 2005, © Springer-Verlag 2005.

Auerbach et al., "Lime: a Java-Compatible and Synthesizable Language for Heterogeneous Architectures", OOPSLA/SPLASH '10, Oct. 17-21, 2010, Reno/Tahoe, Nevada, USA, Copyright © 2010 ACM 978-1-4503-0203-6/10/10, pp. 89-108.

Benveniste et al., "The Synchronous Languages 12 Years Later", Proceedings of the IEEE, vol. 91, No. 1, Jan. 2003, pp. 64-83, © 2003 IEEE.

Bouillet et al., "A Tag-Based Approach for the Design and Composition of Information Processing Applications", OOPSLA '08, Oct. 19-23, 2008, Nashville, Tennessee, USA, Copyright © 2008 ACM 978-1-60558-215-3/08/10, pp. 585-602.

Caspi et al., "LUSTRE: A declarative language for programming synchronous systems", Received Oct. 15, 1986, pp. 178-188, © 1987 0-89791-215-2/87/0100-0178.

Dayal et al., "Data Integration Flows for Business Intelligence", EDBT'09, Mar. 24-26, 2009, Saint Petersburg, Russia, ACM 978-1-60558-422-5/09/0003.

Demers et al., "Cayuga: A General Purpose Event Monitoring System", SIGMOD '08 Proceedings of the 2008 ACM SIGMOD International Conference on Management of Data, pp. 412-422, Copyright © 2008 ACM.

Fielding et al., "Principled Design of the Modern Web Architecture", ACM Transactions on Internet Technology, vol. 2, No. 2, May 2002, pp. 115-150.

Fisher et al., "Interactions with Big Data Analytics", interactions May + Jun. 2012, pp. 50-59, doi: 10.1145/2168931.2168943, © 2012 ACM 1072-5220/12/05.

Gordon et al., "Exploiting Coarse-Grained Task, Data, and Pipeline Parallelism in Stream Programs", ASPLOS '06, Oct. 21-25, 2006, pp. 151-162, San Jose, California, USA, Copyright © 2006 ACM 1-59593-451-0/06/0010.

Hirzel et al., "IBM Streams Processing Language: Analyzing Big Data in motion", IBM J. Res. & Dev., vol. 57, No. 3/4, Paper 7, May/Jul. 2013, pp. 1-11, 0018-8646/13 © 2013 IBM.

IBM, "Stream processing", IBM Systems, as of May 14, 2014, <http://www-03.ibm.com/systems/infrastructure/us/en/technical-breakthroughs/stream-processing.html>.

Lin et al., "A Two-level Programming Model Based on Spreadsheet and Data Flow Chart", 2010 Seventh Web Information Systems and Applications Conference, DOI: 10.1109/WISA.2010.31, pp. 39-42, 978-0-7695-4193-8/10, © 2010 IEEE.

Lisper et al., "Haxcel: A Spreadsheet Interface to Haskell", 14th Int. Workshop on the Implementation of Functional Languages, 2002, pp. 1-17.

Potop-Butucaru et al., "Compiling Esterel", Published by Springer, P.O. Box 17, 3300 AA Dordrecht, The Netherlands, © 2007 Springer, ISBN 978-0-387-70626-9 (HB), ISBN 978-0-387-70628-3 (e-book), 335 pages.

Serafimova, Ilka, "Spreadsheet-based Template Language Prototype for Tree Data Structure Description and Interpretation", CompSysTech '12, Jun. 22-23, 2012, Ruse, Bulgaria, Copyright © 2012 ACM 978-1-4503-1193-9/12/06, pp. 148-154.

Sestoft, Peter, "Implementing Function Spreadsheets", Weuse IV, May 12, 2008, Leipzig, Germany, Copyright 2008 ACM 978-1-60558-034-0/08/05, pp. 91-94.

Wakeling, David, "Spreadsheet functional programming", JFP 17 (1): 131-143, 2007, © 2007 Cambridge University Press, doi:10.1017/S0956796806006186, Printed in the United Kingdom.

Woo et al., "A Spreadsheet Approach to Programming and Managing Sensor Networks", IPSN'06, Apr. 19-21, 2006, Nashville, Tennessee, USA, Copyright 2006 ACM 1-59593-334-4/06/0004, pp. 424-431.

Wu et al., "High-Performance Complex Event Processing over Streams", SIGMOD 2006, Jun. 27-29, 2006, Chicago, Illinois, USA, Copyright 2006 ACM 1-59593-256-9/06/0006. pp. 407-418.

Zaharia et al., "Discretized Streams: Fault-Tolerant Streaming Computation at Scale", SOSP'13, Nov. 3-6, 2013, Farmington, Pennsylvania, USA, ACM 978-1-4503-2388-8/13/11, pp. 423-438.

"Big Data Analytics—Hashdoc", Cloudscale, provided by inventor as of Apr. 11, 2014, pp. 1-6, <http://www.hashdoc.com/documents/8626/big-data-analytics>.

"Build powerful concurrent & distributed applications more easily", Akka, Retrieved Nov. 2013, © 2011-2013 Typesafe Inc., <http://akka.io/>.

"Microsoft Excel Adapter Sample", StreamBase Documentation, provided by inventor as of Apr. 11, 2014, Copyright © 2004-2013 Stream Base Systems, Inc., pp. 1-3, <http://docs.streambase.com/sb66/index.jsp?topic=/com.streambase.sb.ide.help/data/html/samplesinfo/Excel_sample.html>.

"Spreadsheet Add-in for Microsoft Excel" rti, provided in post disclosure comments dated Oct. 1, 2013, <http://www.rti.com/products/dds/microsoft-excel.html>.

* cited by examiner

_700_

| | A | B | C | D | E | F | G | H | I | J | K |
|---|---|---|---|---|---|---|---|---|---|---|---|
| 1 | input Trades | | | | input Quotes | | | | output | | |
| 2 | sym | price | vol | | price | | price*vol | | VWAP | | |
| 3 | "XYZ" | 194.77 | 2,740 | | 196.96 | | 533,670 | | 197.77 | =G24/C24 | |
| 4 | "XYZ" | 195.13 | 2,141 | | =PROJECT(Quotes, pr=price) | | 417,773 | | | | |
| 5 | "XYZ" | 195.56 | 2,539 | | | | 496,527 | | bargain? | | |
| 6 | "XYZ" | 197.96 | 2,498 | | | | 494,504 | | YES | =IF(E3<I3,"YES","NO") | |
| 7 | "XYZ" | 194.96 | 2,639 | | | | 514,499 | | | | |
| 8 | "XYZ" | 197.04 | 2,758 | | | | 543,436 | | | | |
| 9 | "XYZ" | 198.64 | 3,296 | | | | 654,717 | | | | |
| 10 | "XYZ" | 200.99 | 3,111 | | | | 625,280 | | | | |
| 11 | "XYZ" | 200.69 | 2,335 | | | | 468,611 | | | | |
| 12 | "XYZ" | 200.99 | 1,042 | | | | 209,432 | | | | |
| 13 | "XYZ" | 198.77 | 744 | | | | 147,885 | | | | |
| 14 | "XYZ" | 199.20 | 726 | | | | 144,619 | | | | |
| 15 | "XYZ" | 199.07 | 842 | | | | 167,617 | | | | |
| 16 | "XYZ" | 198.99 | 718 | | | | 142,875 | | | | |
| 17 | "XYZ" | 197.70 | 773 | | | | 152,822 | | | | |
| 18 | "XYZ" | 198.84 | 496 | | | | 98,625 | | | | |
| 19 | "XYZ" | 198.16 | 424 | | | | 84,020 | | | | |
| 20 | "XYZ" | 199.15 | 737 | | | | 146,774 | | | | |
| 21 | "XYZ" | 198.71 | 664 | | | | 131,943 | | | | |
| 22 | "XYZ" | 196.73 | 736 | | | | 144,793 | | | | |
| 23 | | sum | | | | | sum | | | | |
| 24 | | | 31,959 | | | | 6,320,423 | | | | |
| 25 | | | =SUM(C3:C22) | | | | =SUM(G3:G22) | | | | |
| 26 | | | | | | | | | | | |

FIG. 7

| | A | B | C | D |
|---|---|---|---|---|
| 1 | input Trades | | | |
| 2 | sym | ts | price | vol |
| 16 | "XYZ" | "Mon Sep" | 194.77 | 2,740 |
| 17 | "XYZ" | "Mon Sep" | 195.13 | 2,141 |
| 18 | "XYZ" | "Mon Sep" | 195.56 | 2,539 |
| 19 | "XYZ" | "Mon Sep" | 197.96 | 2,498 |
| 20 | "XYZ" | "Mon Sep" | 194.96 | 2,639 |
| 21 | "XYZ" | "Mon Sep" | 197.04 | 2,758 |
| 22 | "XYZ" | "Mon Sep" | 198.64 | 3,296 |

FIG. 8

|   | A | B | C | D | E | F | G | H | I | J | K |
|---|---|---|---|---|---|---|---|---|---|---|---|
| 1 | input Trades | | | | | | | | output | | 900 |
| 2 | sym | price | vol | | | | price*vol | | VWAP | | |
| 3 | "XYZ" | 194.77 | 2,740 | | | | 533,670 | | 197.77 | | |
| 4 | "XYZ" | 195.13 | 2,141 | | | | 417,773 | | =G24/C24 | | |
| 5 | "XYZ" | 195.56 | 2,539 | | | | 496,527 | | | | |
| 6 | "XYZ" | 197.96 | 2,498 | | | | 494,504 | | | | |
| 7 | "XYZ" | 194.96 | 2,639 | | | | 514,499 | | | | |
| 8 | "XYZ" | 197.04 | 2,758 | | | | 543,436 | | | | |
| 9 | "XYZ" | 198.64 | 3,296 | | price | | 654,717 | | | | |
| 10 | "XYZ" | 200.99 | 3,111 | | 205.00 | | 625,280 | | | | |
| 11 | "XYZ" | 200.69 | 2,335 | | 200.00 | | 468,611 | | | | |
| 12 | "XYZ" | 200.99 | 1,042 | | 195.00 | | 209,432 | | | | |
| 13 | "XYZ" | 198.77 | 744 | | 190.00 | | 147,885 | | | | |
| 14 | "XYZ" | 199.20 | 726 | | 1 6 11 16 | | 144,619 | | | | |
| 15 | "XYZ" | 199.07 | 842 | | | | 167,617 | | | | |
| 16 | "XYZ" | 198.99 | 718 | | | | 142,875 | | | | |
| 17 | "XYZ" | 197.70 | 773 | | | | 152,822 | | | | |
| 18 | "XYZ" | 198.84 | 496 | | | | 98,625 | | | | |
| 19 | "XYZ" | 198.16 | 424 | | | | 84,020 | | | | |
| 20 | "XYZ" | 199.15 | 737 | | | | 146,774 | | | | |
| 21 | "XYZ" | 198.71 | 664 | | | | 131,943 | | | | |
| 22 | "XYZ" | 196.73 | 736 | | | | 144,793 | | | | |
| 23 | | | sum | | | | sum | | | | |
| 24 | | | 31,959 | | | | 6,320,423 | | | | |
| 25 | | | =SUM(C3:C22) | | | | =SUM(G3:G22) | | | | |
| 26 | | | | | | | | | | | |

| | A | B | C | D | E | F | G | H | I | J | K |
|---|---|---|---|---|---|---|---|---|---|---|---|
| 1 | input Trades | | | | input Quotes | | | | output | | |
| 2 | sym | price | vol | | price | | price*vol | | VWAP | 197.77 | =G24/C24 |
| 3 | "XYZ" | 194.77 | 2,740 | | 196.96 | =PROJECT(Quotes, pr=price) | 533,670 | | bargain? | | |
| 4 | "XYZ" | 195.13 | 2,141 | | | | 417,773 | | YES | =IF(E3<I3,"YES","NO") | |
| 5 | "XYZ" | 195.56 | 2,539 | | | | 496,527 | | | | |
| 6 | "XYZ" | 197.96 | 2,498 | | | | 494,504 | | bargain01 | | |
| 7 | "XYZ" | 194.96 | 2,639 | | | | 514,499 | | 1 | =IF(I7="YES",1,0) | |
| 8 | "XYZ" | 197.04 | 2,758 | | | | 543,436 | | | | |
| 9 | "XYZ" | 198.64 | 3,296 | | | | 654,717 | | bargainCount | | |
| 10 | "XYZ" | 200.99 | 3,111 | | | | 625,280 | | 1,822 | =I19+I11 | |
| 11 | "XYZ" | 200.69 | 2,335 | | | | 468,611 | | | | |
| 12 | "XYZ" | 200.99 | 1,042 | | | | 209,432 | | oldbargainCount | | |
| 13 | "XYZ" | 198.77 | 744 | | | | 147,885 | | 1,821 | =PRE(I15,I3,0) | |
| 14 | "XYZ" | 199.20 | 726 | | | | 144,619 | | | | |
| 15 | "XYZ" | 199.07 | 842 | | | | 167,617 | | | | |
| 16 | "XYZ" | 198.99 | 718 | | | | 142,875 | | | | |
| 17 | "XYZ" | 197.70 | 773 | | | | 152,822 | | | | |
| 18 | "XYZ" | 198.84 | 496 | | | | 98,625 | | | | |
| 19 | "XYZ" | 198.16 | 424 | | | | 84,020 | | | | |
| 20 | "XYZ" | 199.15 | 737 | | | | 146,774 | | | | |
| 21 | "XYZ" | 198.71 | 664 | | | | 131,943 | | | | |
| 22 | "XYZ" | 196.73 | 736 | | | | 144,793 | | | | |
| 23 | | sum | sum | | | | sum | | | | |
| 24 | | | 31,959 | | | | 6,320,423 | | | | |
| 25 | | | =SUM(C3:C22) | | | | =SUM(G3:G22) | | | | |
| 26 | | | | | | | | | | | |

|   | A | B | C | D | E | F | G | H | I | J | K | L |
|---|---|---|---|---|---|---|---|---|---|---|---|---|
| 1 | *Decision table example* | | | | | | | | | | | |
| 2 | | | | | | | | | | | | |
| 3 | input | | | ticket prices | | | output | | | | | |
| 4 | person | kind | | kind | dollars | | person | charge | | | | |
| 5 | bob | student | | child | 0 | | bob | 10 | | | | |
| 6 | | | | student | 10 | | =A5 | =VLOOKUP(B5,D5:E8,2,FALSE) | | | | |
| 7 | | | | senior | 10 | | | | | | | |
| 8 | | | | regular | 15 | | | | | | | |
| 9 | | | | | | | | | | | | |

|    | A | B | C | D | E | F | G | H | I | J | K | L |
|---|---|---|---|---|---|---|---|---|---|---|---|---|
| 41 | *State machine example* | | | | | | | | | | | |
| 42 | | | | | | | | | | | | |
| 43 | input | | transition table | | | | | | output | | | |
| 44 | activity | | state | approach | drop | pickup | leave | | state | | | |
| 45 | leave | | gone | there | gone | gone | gone | | alert | =VLOOKUP( G51, C44:G48, MATCH(A45,D44:G44), FALSE) | | |
| 46 | | | there | there | dropped | there | gone | | | | | |
| 47 | | | dropped | dropped | dropped | there | alert | | | | | |
| 48 | | | alert | there | gone | gone | gone | | | | | |
| 49 | | | | | | | | | | | | |
| 50 | | | | | | | oldState | | =PRE(I45,A45,gone) | | | |
| 51 | | | | | | | dropped | | | | | |
| 52 | | | | | | | | | | | | |

FIG. 15

STREAM-ENABLED SPREADSHEET AS A CIRCUIT

BACKGROUND OF THE INVENTION

The present invention relates generally to the field of computer-implemented spreadsheets, and also to the field of stream processing ("streaming").

A computer-implemented spreadsheet is an interactive computer application program for organization and analysis of tabular data. The program operates on data represented as cells of an array, organized in rows and columns. Each cell of the array can contain either raw data or the results of formulas that automatically calculate and display a value based on the contents of other cells. The user of a spreadsheet can make changes in any cell and can immediately observe the effects on calculated values, whether in tabular or graphical form. Spreadsheets are relatively ubiquitous and are useful in a wide variety of domains. However, they are generally based on a functional programming paradigm, so cannot easily handle computations that depend on the results of historic computations, or program state.

Stream processing is a programming paradigm under which a sequence of data (a "data stream," or, more simply, a "stream") is processed substantially immediately as each element is received. A stream processing application applies continuous analytics (for example, analytics updated over relatively short time intervals, such as in "real-time") to an ever-changing stream of data. Stream processing takes as input one or more streams, each of which can be thought of as an infinite sequence of tuples, performs some analysis or transformation on that data, and produces one or more output streams as a result. Special-purpose languages, such as the various flavors of Continuous Query Language (CQL), exist for writing programs that process streaming data.

A digital circuit is a computational construct that takes a set of discrete-valued inputs and transforms them into a set of discrete-valued outputs. Such a circuit may be purely combinatorial, where the output is a pure function of the present input only, or sequential, where the output depends not only on the present input but also on the history of the input. A flip-flop, or latch, is typically used as a memory element of a sequential circuit for retaining information about input history, or state. Sequential circuits may be either synchronous or asynchronous. In a synchronous circuit, the state of the circuit changes only at discrete times in response to a dedicated clock signal, while in an asynchronous one, the state of the circuit can change at any time in response to changing inputs.

SUMMARY

According to an aspect of the present invention, there is a method, computer program product and/or system that performs the following steps (not necessarily in the following order): (i) provides a computer-implemented spreadsheet program; (ii) accepts instructions from a user, through a formula language of the spreadsheet program, corresponding to transformations of data input into one or more input cells into data output into one or more output cells; and (iii) stores the instructions as a circuit representation that can be used to perform the transformations of the input data into the output data independently of the spreadsheet program.

BRIEF DESCRIPTION OF THE DRAWINGS

FIG. 7 is a second screenshot view of a fourth embodiment system;

FIG. 8 is a third screenshot view of a fourth embodiment system;

FIG. 9 is a fourth screenshot view of a fourth embodiment system;

FIG. 10 is a fifth screenshot view of a fourth embodiment system;

FIG. 12 is a screenshot view of a sixth embodiment system;

FIG. 15 is a screenshot view of a ninth embodiment system.

DETAILED DESCRIPTION

Figure 1:
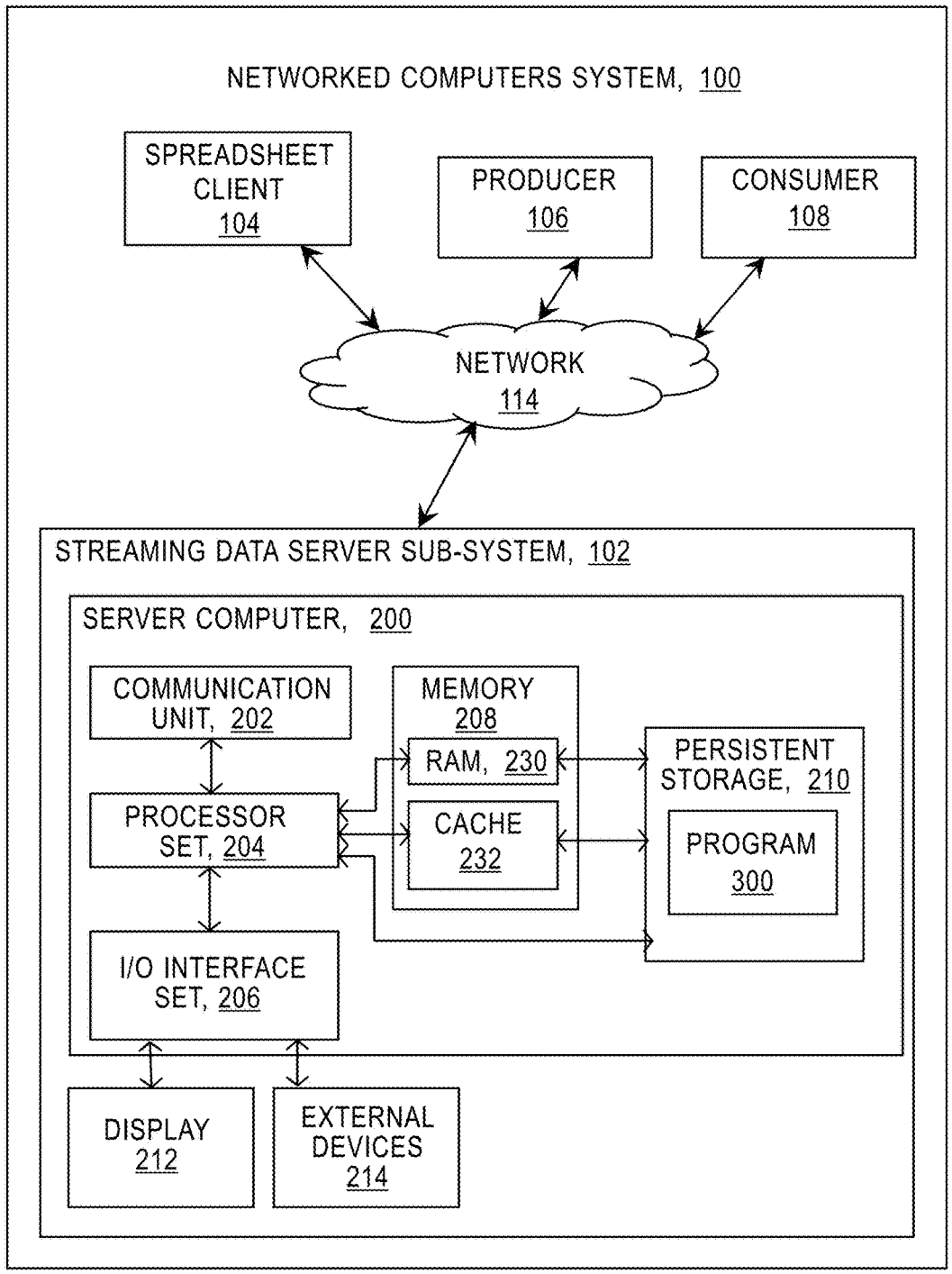
FIG. 1 is a block diagram view of a first embodiment of a system according to the present invention.

Some embodiments of the present invention allow a user to manipulate streaming data using both stateful and stateless operations through a familiar spreadsheet-style interface. In some embodiments, resulting data streams can be published and shared, and/or the computations themselves can be exported as a circuit having well-specified timing semantics which can then be run on a hardware or software execution engine. Running the computations as a circuit independent of the user interface permits high-performance, continuous analytics on large amounts of data over long periods of time.

This Detailed Description section is divided into the following sub-sections: (i) The Hardware and Software Environment; (ii) Example Embodiment; (iii) Further Comments and/or Embodiments; and (iv) Definitions.

I. THE HARDWARE AND SOFTWARE ENVIRONMENT

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including: streaming data server sub-system 102; spreadsheet client 104; producer 106; consumer 108; communication network 114; server computer 200; communication unit 202; processor set 204; input/output (I/O) interface set 206; memory device 208; persistent storage device 210; display device 212; external device set 214; random access memory (RAM) devices 230; cache memory device 232; and program 300.

Sub-system 102 is, in many respects, representative of the various computer sub-system(s) in the present invention. Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 300 is a collection of machine readable instructions and/or data that is used to create, manage and control certain software functions that will be discussed in detail, below, in the Example Embodiment sub-section of this Detailed Description section.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

II. EXAMPLE EMBODIMENT

Figure 2:
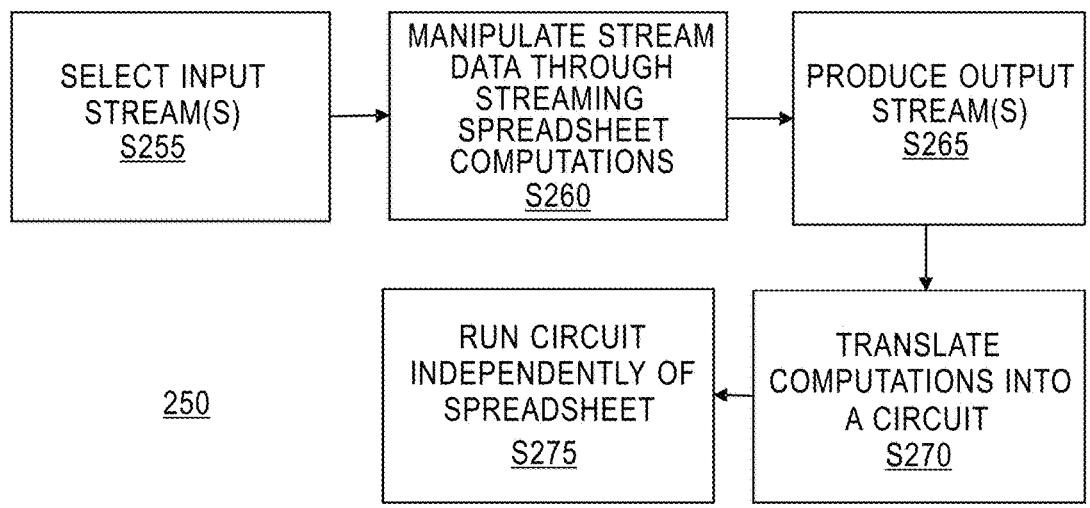
FIG. 2 is a flowchart showing a first embodiment method performed, at least in part, by the first embodiment system.
Figure 3:
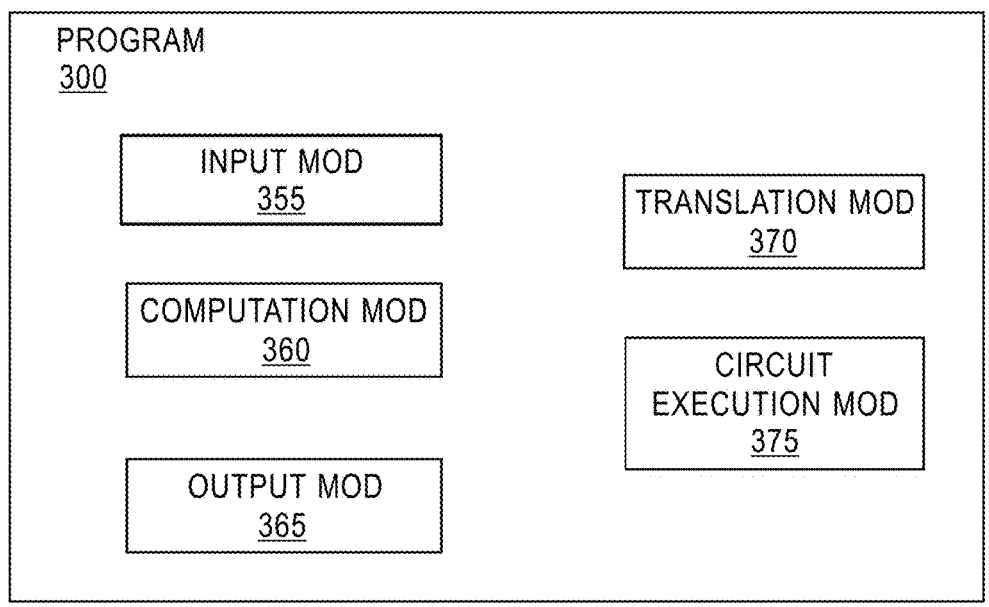
FIG. 3 is a block diagram view of a machine logic (for example, software) portion of the first embodiment system.

FIG. 2 shows flowchart 250 depicting a method according to the present invention. FIG. 3 shows program 300 for performing at least some of the method steps of flowchart 250. This method and associated software will now be discussed, over the course of the following paragraphs, with extensive reference to FIG. 2 (for the method step blocks) and FIG. 3 (for the software blocks).

For the sake of simplicity, the user interface for the example embodiment presented here is identical to that of the sample embodiment presented in subsection III.B below, where further descriptive details about that user interface can be found. Accordingly, some of the Figures associated with that embodiment, as well as the example application described there, will also be referenced here. However, the embodiment here differs in terms of its system architecture, including through the use of thin spreadsheet client 104, with the spreadsheet application itself hosted on server sub-system 102 in the cloud as part of program 300 (see FIG. 1). It will be evident to those of skill in the art that this is just one of numerous possible architectural variations.

Processing begins at step S255, where input module ("mod") 355 connects to an input data stream in response to user direction (see FIG. 10). Here, the user has directed input mod 355 to connect to two independent data streams, "Trades" and "Quotes," both produced in this case by streaming data producer 106 (see FIG. 1). The user has selected to filter the "Trades" stream so as to only consume the "symbol," "price," and "volume" attributes of stream data for XYZ Company. Thus, the "Trades" input will only update in the spreadsheet when new "Trades" data for XYZ Company is produced. As can be seen in FIG. 10, the user has allocated the range A3 to C22 as the window over which to hold this streaming data, which scrolls from bottom to top as the live data updates. In other words, when a new tuple of "Trades" data for XYZ Company is produced, that tuple automatically enters the spreadsheet in row 22 of the specified range, while row 21 is updated to hold the data previously found in row 22, and so on up to row 3. The data previously held in row 3, absent any instruction to the contrary, is discarded and is no longer accessible as an input to spreadsheet calculations. This is a case of using state for working with windows of information, as each row in the window updates to reflect the value previously in the row below it.

The user has also selected to filter the "Quotes" stream to show only the "price" attribute of "Quotes" stream data for XYZ Company. The window for "Quotes" is only 1 cell large, which updates whenever a new quote for XYZ Company is produced by producer 106. Because the "Trades" and "Quotes" streams are independent, no synchrony is imposed on when each window updates—each window will update, or tick, whenever a new tuple of data is available in that window's respective stream that meets the specified criteria. Note that there is a distinction between new data and different data: new data arrives in a cell whenever that cell ticks, but the value of that data may be the same as the previous value in that cell. Note further that value-based filtering (in this case, selecting only tuples relating to XYZ Company) is one way of manipulating data rates.

Processing proceeds to step S260, where computation mod 360 performs other rate- and value-based transformations of the input data as specified by the user. Referring again to FIG. 10, cells G3 to G22, C24, and G24 are conventional spreadsheet formulas that calculate and update in the conventional way. In other words, their values are recomputed automatically whenever a new "Trades" tuple enters the "Trades" input window. Their updates are thus synchronized with the updates to the "Trades" window.

Cell I3 is likewise synchronized with the "Trades" window. Cell I7, however, is different. Because cell I7 depends on both cell I3, linked to "Trades," and cell E3, linked to "Quotes," cell I7 updates whenever either the "Trades" window or the "Quotes" window updates. Alternatively, the user may wish to specify a different tick for this cell, such as, say, that it only update when E3 updates. In that case an additional, optional variable would be included in the formula for cell I7 to specify that its tick should be tied to E3 only. This is an example of rate-based filtering, which is another way of manipulating data rates. Rate- and value-based filtering can be combined to create more sophisticated filters (for example, via a resultant rule such as "only update I7 when E3 ticks and E3's value has changed from its previous value" or "sum a window of 5 values only every 5 ticks of that window"). Besides Boolean comparison, other forms of value-based filtering include (but are not necessarily limited to) deduplication, compression, and aggregation, while sampling is another example of rate-based filtering.

Of the remaining cells containing formulas—I11, I15, and I19—the first two update in synchrony with cell I7, whereas I19 updates in synchrony with I3, as specified by the second argument to the PRE function (which takes the previous value of the cell referenced by the first argument when the cell referenced by the second argument ticks). Notice that because cells I15 and I19 each contain a reference to the other in their respective formulas, they form what would be a prohibited circular reference in a conventional spreadsheet. Here, however, PRE avoids this logical dilemma by specifying that the previous state of the referenced cell should be retained and used for the purposes of the calculation. Such calls may be nested to arbitrary depth. This is a case of using state for working with cyclic cell references or state machines. Notice also that the user could have designed I19 to tick in synchrony with E3 or I7 instead of with I3, and that in each case the semantics of I15 and I19 would be slightly different. This is yet another example of the fine-grained ability a user has to manipulate data rates—and data semantics—in this embodiment of the present invention.

Processing proceeds to step S265, where output mod 365 publishes zero or more output streams specified by the user. Any cell is a potential candidate. Here the user selects cells E3, I3, and I7 to output as a single stream which ticks when any of its constituent cells does (in this case, the ticks of the output stream will be the same as those of I7). Even a cell with a constant value can be included in an output stream. Once published, the stream(s) can be subscribed to by others on the network with appropriate access rights, such as consumer 108 (see FIG. 1). However, the output stream(s) will only be produced so long as the spreadsheet is open and running.

Processing proceeds to step S270, where translation mod 370 translates the existing spreadsheet computations into a circuit, which it then exports from the spreadsheet. The user selects which cells to include in the output stream, and optimizations may be performed accordingly. For instance, given the selection of cells E3, I3, and I7 for the exported computation, the circuit need not include logic for the computations in cells I11, I15, and I19. Other optimizations may also be possible. In some cases, the user may elect to export multiple combinations of cells as different, independent circuits.

The circuit representation generated by translation mod 370 may take any form that corresponds to the components and connections of a digital circuit specifically designed for the represented computation(s)—that is, any form that has well-specified timing semantics, including clear definitions, as applicable, for synchrony, history, and delays. If only conventional spreadsheet computations are included, the circuit may be combinatorial. If state information must be retained, as in the example with E3, I3, and I7, the circuit will be sequential. Translating and exporting computations as a circuit allows them to persist even after the spreadsheet itself is closed, and can also result in improved performance. In this embodiment, the circuit is represented using a hardware description language (HDL). In some embodiments, the computation may be exported in other forms of software, such as bytecode for a virtual machine, or it may be translated directly into hardware such as via 3D printing or the programming of a field-programmable gate array (FPGA).

Processing proceeds to step S275, where circuit execution mod 375 executes the exported circuit, producing output streams that can be subscribed to by consumers with appropriate access rights, such as consumer 108 (see FIG. 1). In this embodiment, the circuit is executed in software by a simulator that translates the HDL specification into native machine language for the general-purpose central processing unit(s) (CPU(s)) of processor set 204 of server computer 200. Alternatively, the circuit may be run on a set of one or more virtual machines, graphics processing units (GPUs), or application-specific integrated circuits (ASICs), to name a few examples, and/or the circuit itself may be shared rather than, or in addition to, its output.

The following facts, potential problems and/or potential areas for improvement with respect to the current state of the art are recognized by some embodiments of the present invention: (i) spreadsheets are familiar end-user programming tools; (ii) spreadsheets can be used for programming streaming computations, that is, computations that consume continuous input streams and produce continuous output streams of data; and/or (iii) how to implement a streaming spreadsheet faithfully and efficiently remains an open problem.

Moreover, some embodiments of the present invention recognize that: (i) streaming computation in a spreadsheet alone may lead to low throughput, high latency, and/or lack of persistence (when the spreadsheet is closed, the computation stops); (ii) streaming computation in a streaming engine alone is unfamiliar to most end-users, making this approach difficult to use; and/or (iii) the desirability of combining a spreadsheet with a streaming engine may be enhanced for the system with one or more of the following properties: (a) high feature coverage of familiar spreadsheet idioms, (b) high fidelity to conventional spreadsheet semantics, and/or (c) the ability to specify detailed timing relationships between and among various data items and related calculations.

Therefore, some embodiments of the present invention may include one, or more, of the following features, characteristics and/or advantages: (i) translate the formulas in a spreadsheet into a circuit; (ii) a translated circuit that has well-specified timing semantics, including clear definitions for synchrony, history, and/or delays; and/or (iii) a circuit that is faithful to the computation in the original spreadsheet, implementing the same formulas and references. These embodiments recognize that such features may provide one or more of the following advantages: (i) the circuit approach facilitates better throughput and reduced latency, because, for example, (a) the circuit can run on a server, (b) the circuit represents a fixed computation, and/or (c) the circuit can be further optimized; (ii) the circuit can continue running even when the user closes the spreadsheet client, thus persisting the computation and/or making it reusable for other users; (iii) the programming interface is still the spreadsheet client, which is familiar to end-user programmers; and/or (iv) translating a streaming spreadsheet into a circuit yields high fidelity to the original spreadsheet semantics and timing.

III. FURTHER COMMENTS AND/OR EMBODIMENTS

This Further Comments and/or Embodiments section of the Detailed Description is divided into the following subsections: (i) Introduction; (ii) Sample Embodiment; (iii) Spreadsheet Calculus; (iv) Architecture; (v) Example Applications; and (vi) Conclusion.

A. Introduction

Some embodiments of the present invention recognize that continuous data streams are ubiquitous: they arise in telecommunications, health care, finance, and transportation, among other domains. They further recognize that these data streams represent such a high volume of data that they cannot be stored to disk in raw form, and it is often crucial for the data to be analyzed right away.

Some embodiments of the present invention recognize the following facts, potential problems and/or potential areas for improvement with respect to the current state of the art: (i) in organizations that require stream processing, domain experts may have limited programming experience to directly implement their desired solutions; (ii) as a result, such domain experts—end-users—typically rely on developers for the actual implementation of their solutions; and/or (iii) having an easy way for these end-users to directly prototype and perform computations on live data may be an important facilitator for rapid turnaround and lower development costs that may otherwise hinder streaming data analysis.

Moreover, some embodiments of the present invention recognize that: (i) spreadsheets are a pervasive tool used in many different domains, and are familiar to non-programmers; (ii) spreadsheets offer a variety of visualization possibilities, and the ability to analyze, process, or augment source data by entering formulas in cells; and/or (iii) spreadsheets provide a unique interface where data is in the foreground and the code that produced it can be viewed in the same place, unlike in common integrated development environments (IDEs) where code appears in a dedicated editor and data visualization plays a subordinate and often orthogonal role; but that (iv) although spreadsheets are used for many different applications, they do not readily support online stream processing.

Some embodiments of the present invention recognize that a spreadsheet with the following features would help support online stream processing: (i) live data in cells; (ii) segmenting streams into windows; and/or (iii) stateful cells. For online processing, the ability to import live data into cells is advantageous. Further, as the live data changes, the value of the cell should change contemporaneously. For online stream processing, an analogue between spreadsheet ranges and windows over streams is likewise advantageous. This is because some streaming operations are applied over aggregates of values (for example, reductions), while in spreadsheets, aggregates are groups of rows and columns known as "ranges." Finally, with respect to stateful cells, it is noted that spreadsheets are functional by nature and do not readily support state or cyclic cell references. However, many stream processing applications need state to compute summaries or decisions via finite state machines.

Accordingly, some embodiments of the present invention may include one, or more, of the following features, characteristics and/or advantages: (i) provide a programming platform for stream processing that is based on a spreadsheet paradigm with enhancements to meet the challenges described above; (ii) use spreadsheets as a stream programming platform; (iii) provide for the use of live data in spreadsheet cells; (iv) provide for the segmenting of streams into windows; (v) provide for stateful cells; (vi) provide a language that an end-user can use to easily populate ranges of cells in a spreadsheet with the desired shape of data; (vii) provide a windowing mechanism that allows computations over windows of streaming data; (viii) provide the ability to perform stateful computations by treating stateful and stateless cells uniformly; (ix) retain and interoperate with familiar spreadsheet features (such as built-in functions and macros, visualizing data, and so on); (x) enhance native spreadsheet capabilities such that they operate correctly on live data (for example, pivot tables that continuously pivot as the input cells change, rather than providing filtered results of a static snapshot of cells); (xi) provide a client-server architecture in which the server publishes streams; (xii) provide a client-server architecture in which the client (spreadsheet) allows the user to subscribe to streams and operate on the live data, which operations can include visualization of streams and generation of new streams; and/or (xiii) include a client that provides an export feature, making it possible to share the results with other users and to persist computations on a server beyond the life of the spreadsheet itself.

Some embodiments of the present invention may include one, or more, of the following features, characteristics and/or advantages: (i) make it easier for analysts, with little programming experience, to develop continuous analytics applications directly; (ii) enhance a spreadsheet—a pervasive tool—to obtain a programming platform for stream processing; (iii) include an enhanced spreadsheet that enables visualizing live streams, live programming to compute new streams, and/or exporting computations to be run on a server; and/or (iv) include exported computation that can be shared with other users and/or persisted beyond the life of the spreadsheet.

Figure 4:
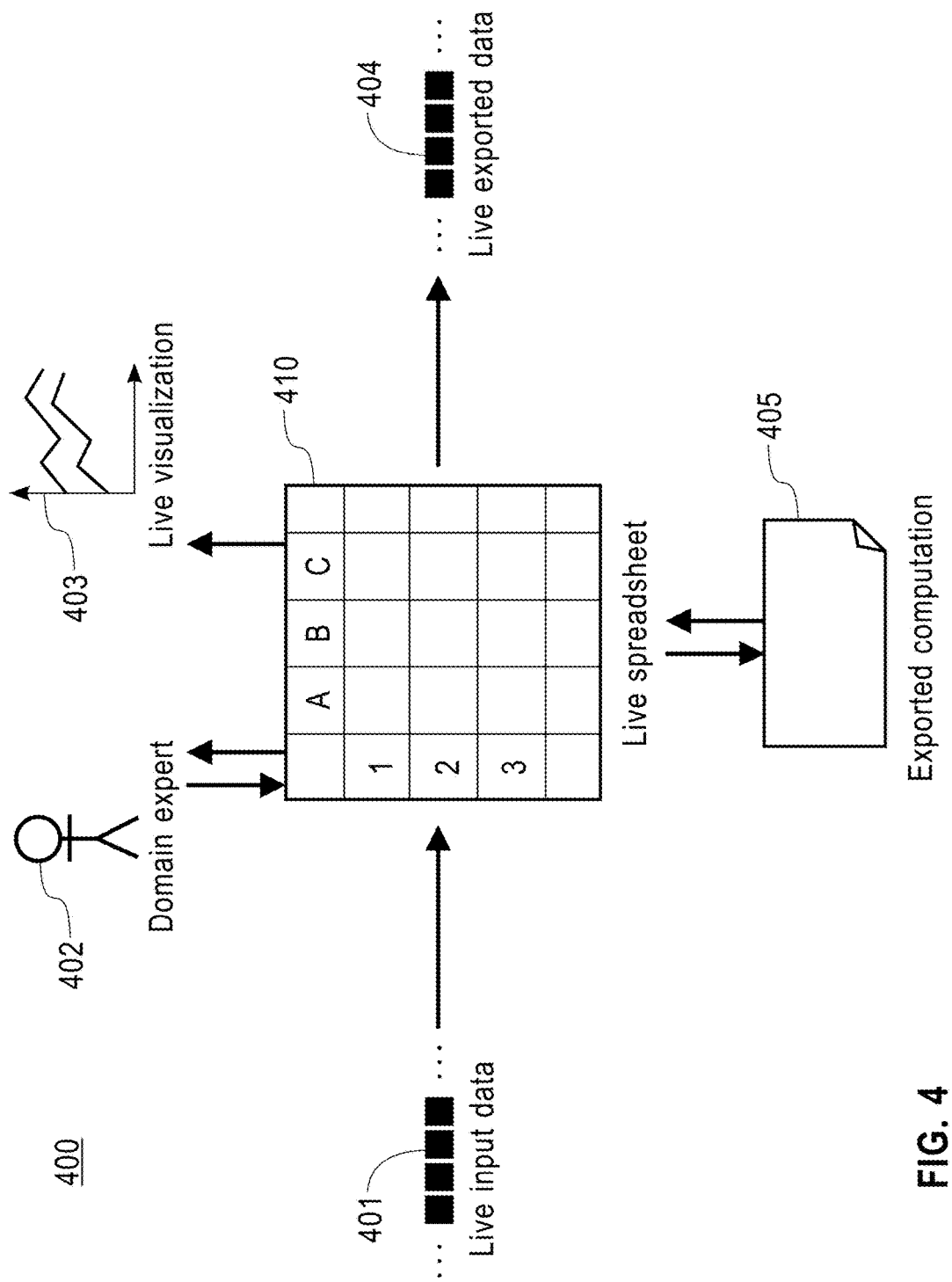
FIG. 4 is a block diagram view of a second embodiment system.

Shown in FIG. 4 is diagram 400, presenting an architectural overview according to an embodiment of the present invention. Diagram 400 includes: live input data (live streams) 401; domain expert (end-user) 402; live visualization 403; live exported data 404; exported computation 405; and (client) spreadsheet 410. A server (not shown) publishes live streams 401. Domain expert 402 subscribes to these streams and prototypes the desired computation in spreadsheet 410. Spreadsheet functionality is readily available, including visualization 403. Data computed in the spreadsheet may be exported as its own stream 404, and the entire spreadsheet 410 may be exported to the server as computation 405, where it outlives client shutdown.

Some embodiments of the present invention include a core language, or spreadsheet calculus, that is captured by a user interface. This is a reactive programming model that represents the spreadsheet computation as a combinatorial circuit derived from cell dependencies and formulas contained within the cells. As input cells change over time, any dependent cells are automatically recomputed and updated. Cells that must retain state can be viewed as circuits with latches. This model hides many common concerns from the programmer, because it offers a fixed control structure and manages cell updates automatically based on data dependencies. As a result, the domain expert can focus on the data transformations they wish to compute.

In some embodiments of the present invention, a spreadsheet enables a live programming platform, meaning that code can be modified during the execution of the program. This is valuable because streaming analytics applications cannot be stopped and restarted easily. Instead, it is better if the user can quickly modify computations without stopping data sources. This feature creates challenges, especially in the face of stateful computations, but its semantics can be formally defined in the spreadsheet calculus. Also, in some embodiments of the present invention, extensions to the classical spreadsheet preserve its highly interactive nature, meaning that on every update to a cell, there is only a bounded amount of computation and memory usage. Some embodiments of the present invention include this property in their core language, and/or include a core language which is deterministic, meaning that for any given sequence of inputs, the spreadsheet computation always yields the same result.

Some embodiments of the present invention include one, or more, of the following features, characteristics and/or advantages: (i) a reactive programming model for stream processing based on spreadsheets and a uniform treatment of stateless and stateful cells; (ii) formal semantics for a core language incorporated into a spreadsheet calculus; and/or (iii) the ability to export spreadsheet computations to a server for sharing or persistence.

Some embodiments of the present invention attempt to address a general problem of non-programmer end-users (such financial analysts) being able to program for stream processing applications, where stream processing is defined as continuous analytics of data in motion. To do this, these embodiments implement a streaming spreadsheet both faithfully and efficiently, and allow expression of a streaming spreadsheet as a circuit. Such implementations provide the advantages of familiarity of a spreadsheet interface, high performance, persistence and sharing, a high degree of feature coverage, and semantic fidelity.

In some embodiments of the present invention, a circuit is a set of cells. A cell c uses a formula f to define a feed. A feed is a map from ticks (when a cell gets updated) to values, and can be expressed as:

$$f::=\phi|op(c_1,\ldots,c_n)|\text{latch}(c_0,c_1)|\text{when}(c)|c_0@c_1$$

where $\phi$ represents a server feed (for example, Trades.sym, the ticker symbol for a given stock transaction); $op(c_1, \ldots, c_1)$ is a function of the inputs $c_1, \ldots, c_n$ (for example, the spreadsheet formula G24/C24); $\text{latch}(c_0, c_1)$ is the value of $c_0$ recorded at the last (previous) tick of $c_1$ (used for scrolling values in a window and the PRE function, which retrieves previous values of a cell); when(c) only ticks if c evaluates to true; and $c_0@c_1$, which gives the value of $c_0$ when $c_1$ ticks.

Some embodiments of the present invention implement a streaming spreadsheet as a circuit, and include one or more of the following features, characteristics and/or advantages: (i) user interface features for consuming and/or producing streams; (ii) spreadsheet operators for manipulating rates; (iii) a translator for translating a computation from a spreadsheet representation to a circuit; and/or (iv) an engine for running the circuit resulting from (iii).

Figure 5:
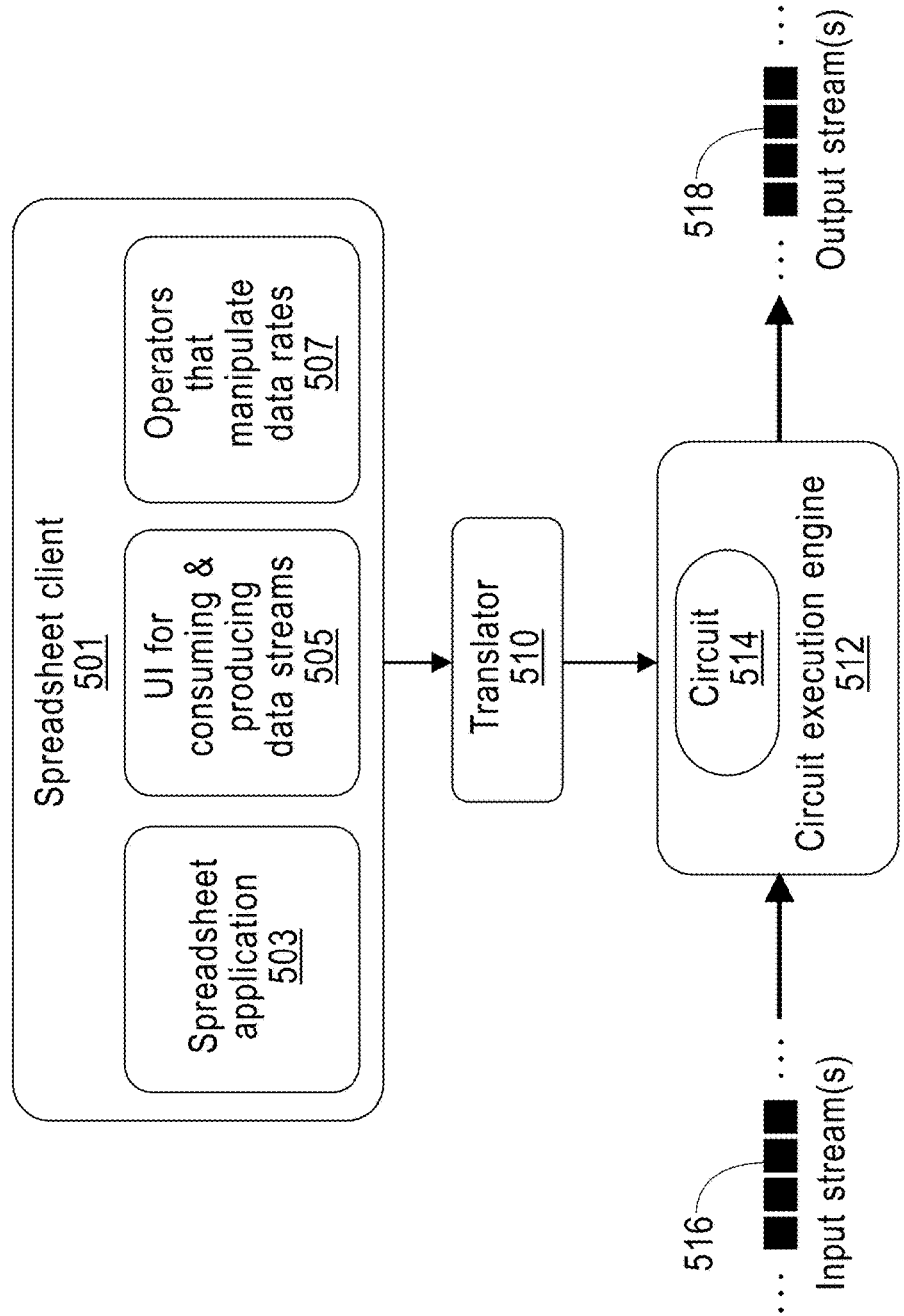
FIG. 5 is a block diagram view of a third embodiment system.

Shown in FIG. 5 is diagram 500, representing an embodiment of the present invention. Diagram 500 includes: spreadsheet client 501, in turn including spreadsheet application 503, user interface 505, and operators 507; translator 510; circuit execution engine 512, including circuit 514; and input and output streams 516 and 518, respectively. Spreadsheet client 501 includes spreadsheet application 503, a familiar environment for many end-users, together with a special user interface supplement for consuming and producing data streams and operators for manipulating data rates, such as through filtering, aggregating, or downsampling. Once a new stream is created by an end-user in spreadsheet client 501, translator 510 is invoked to convert the stream transformation represented by the spreadsheet computations into circuit 514, which is then run on circuit execution engine 512, consuming input stream 516 and producing output stream 518 in turn. The circuit so created exists independently of the spreadsheet client and application from which it was derived, and can be run much more efficiently in this manner.

Shown in FIG. 10 is screenshot 1000, explained in greater detail in subsection B below. FIG. 10 highlights some of the features of an embodiment of the present invention, including: (i) a familiar spreadsheet interface; (ii) the ability to consume streaming data (cells A3 to C22), which scrolls from bottom to top; (iii) the ability to produce an output stream (such as cell I3) by manipulating streaming data; (iv) the ability to combine rates (for example, cell I7, which is updated whenever new values arrive in either the "input Trades" window or the "input Quotes" window); and (v) the ability to work with stateful cells (such as via what would otherwise be a circular reference between cells I15 and I19—here, the prior value of I15 is latched into cell I19 as the prior value is replaced by the current value in cell I15).

Some embodiments of the present invention include one or more of the following features, characteristics and/or advantages: (i) include a spreadsheet that can both subscribe (import data) and publish (export data); (ii) work with real-time data; (iii) are faithful to the spreadsheet idiom; (iv) have timing semantics for reconciling input streams on different clocks; (v) can retain state, such as for windowing or state machines; (vi) can export computation from formulas; and/or (vii) can export computation as a circuit, such as via an interpreter or translator.

B. Sample Embodiment

A sample embodiment is now presented which uses a streaming stock bargain calculator as a running example. This sample embodiment represents an example only, and should be understood as one possible embodiment rather than expressing any particular limitations. The bargain calculator takes two input streams: Trades and Quotes. A "stream" is an infinite sequence of tuples, which are sequences of attribute/value pairs. A "feed" is the infinite sequence of values corresponding to a single attribute of a stream. Thus a stream is composed of a collection of feeds whose values update synchronously.

The tuples of the Trades stream represent actual trades that have been made, using attributes sym (a stock symbol), ts (a timestamp), price, and vol. Each of these attributes defines a feed of values. The bargain calculator first computes the Volume Weighted Average Price (VWAP). Given a window of prices $P_i$ and volumes $V_i$, the VWAP is defined as:

$$VWAP = \frac{\sum_i P_i \times V_i}{\sum_i V_i}$$

After computing the VWAP over the Trades stream, the bargain calculator determines whether or not each price in the Quotes stream is less than the VWAP. If yes, it outputs a bargain. Various streaming languages known in the art are well-suited to writing this program. However, end-users are typically unfamiliar with programming languages, let alone special-purpose languages such as those used for stream processing. Some embodiments of the present invention therefore bring stream programming to the end-user by enhancing the spreadsheet, a tool that is pervasive and familiar.

Figure 6:
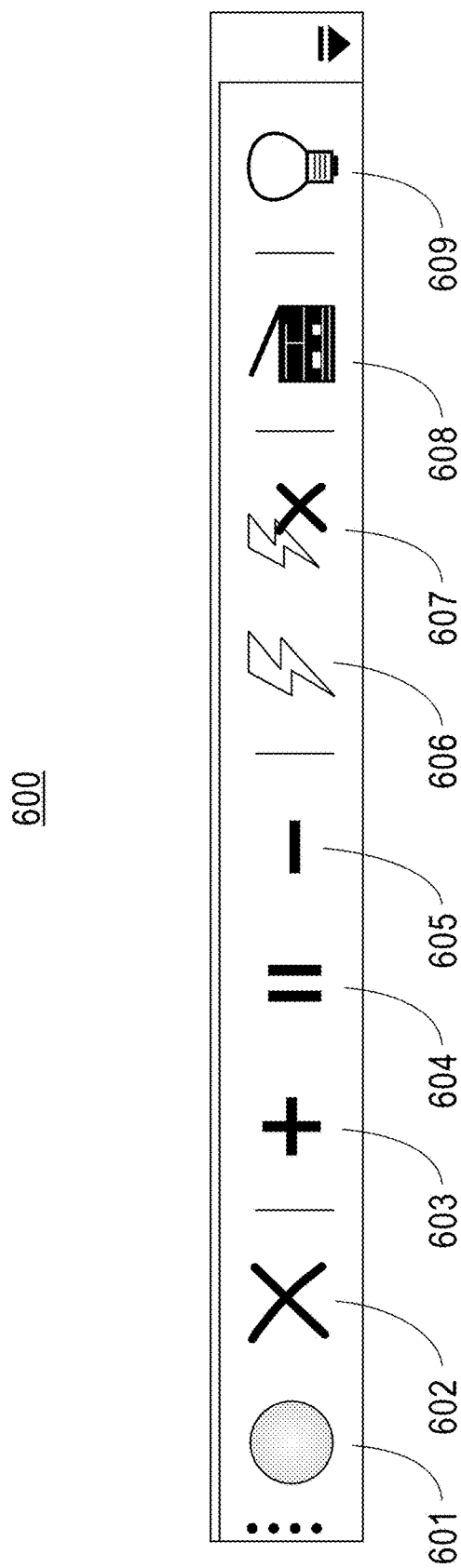
FIG. 6 is a first screenshot view of a fourth embodiment system.

This sample embodiment is based on a spreadsheet enhanced with controls for manipulating live streams. These controls, shown in FIG. 6, are part of control bar 600 and include: "connect to a server" 601; "disconnect from a server" 602; "add (subscribe to) a stream" ('+' icon) 603; "pause a stream" (pause symbol) 604; "disconnect from a stream" ('−' icon) 605; "export data back to the server" (flash symbol) 606; "stop data export" (crossed out flash symbol) 607; "export computation" (movie symbol) 608; and "debug mode" (light bulb) 609, used to debug the implementation. A spreadsheet having controls such as these for manipulating live streams may at times be referred to herein as a "streaming spreadsheet."

FIG. 7 shows the bargain calculator program as screenshot 700. How a user can obtain this program step by step will now be described. Those of skill in the art will recognize the steps do not necessarily have to be performed in the order shown.

Step 1: Connecting to a server. To start using the streaming spreadsheet, the user first clicks on "connect" button 601 (see FIG. 6). This prompts for the address to the server of interest and connects to it. The server publishes several streams that the client may subscribe to, visualize, and work with. Depending on the server's installation, these streams could come from many different sources, including existing stream processing programs, live feeds, static data that is streamed, and/or exported streams from other streaming spreadsheet clients. In the case of this example, the server publishes the two input streams Trades and Quotes.

Step 2: Subscribing to a stream. The next step is to subscribe to a stream. To do this, the user first chooses a window in the spreadsheet, then presses "subscribe" button ('+') 603, and enters the stream name at the prompt. The selected stream is then displayed in the window that the user selected with one column per attribute (feed), and the values scroll from bottom to top. A visual indicator comes on if the user did not select a wide enough range of cells. At any given moment in time, the user sees a window of data that gets updated continuously.

In this example, the user first subscribes to the Trades input stream. FIG. 8 shows screenshot 800, with the Trades input streaming into the spreadsheet in columns A through D over a window of size 20. The data fills the window from bottom to top and continues scrolling. The chosen window size not only specifies how much of the stream is shown at any given moment in time, it also determines the window of data over which the VWAP will be computed. The user may pause a stream by choosing a cell in it, and pressing pause button 604 (see FIG. 6). This causes all the feeds in that stream to stop until the user presses pause again to resume, which causes the latest live data to be displayed.

Step 3: Adding new feeds. The user can create new data by entering formulas in cells directly, which creates new feeds. Screenshot 900 in FIG. 9 shows how the user enters a standard spreadsheet formula to compute the price times the volume in cell G3. Notice that, in this Figure, the timestamp column has been deleted from the streaming input window because it is not needed (compare to FIG. 8). The user then copies and pastes the formula in the rest of column G with familiar spreadsheet gestures. Even though familiar controls are used to populate column G, the result is live in this streaming spreadsheet: as the values of price and volume are updated, their product is recomputed. FIG. 9 further shows how the user can compute the sum for the volume and price-times-volume columns (cells C24 and G24), and enter a formula for the VWAP (cell I3). Each feed in the streaming spreadsheet gets updated at specific points in time, called its "tick." For example, the sum of two cells gets updated whenever either of the cells is updated.

Step 4: Adding new streams. In addition to entering formulas in cells one at a time, the user can also populate a range of cells with a stream (synchronous feeds) using the streaming spreadsheet's query language. Here this language is relational in flavor, and includes operators for projection, selection, deduplication, sorting, pivoting, and aggregation. Some alternative embodiments may offer simple wizards to further hide the query language from the end-user. The language also supports a simple mechanism for stateful computation. Queries are entered by selecting a window in the spreadsheet and pressing '+' icon 603 (see FIG. 6). The simplest query is giving the name of a stream to display all of its attributes. As a slightly more complicated example, the user may use a selection to filter tuples in Trades to include only those with a price greater than a certain value:

select(Trades, price >200)

This would populate a range of cells with formulas to produce the desired result: a stream with all the attributes of Trades but only with tuples having a price greater than 200.

Step 5: Bargain computation. Notice that the output of a query can still be a single feed: a projection, for example, can be used to view a single attribute of a stream. In cell E3 of screenshot 1000 of FIG. 10, the user has added the Quotes input stream, using a query that only shows the price attribute:

project(Quotes, pr=Quotes.price)

This query takes the Quotes stream and produces a new stream that has a single attribute named pr. The new stream ticks synchronously with Quotes. Finally, the user enters a spreadsheet conditional to determine whether or not the quoted price is a bargain (cell I7).

Step 6: Exporting Data. The user may want to export data back to the server. This can be accomplished by selecting the quoted price and whether or not it is a bargain (cells I3 and I6), and pressing flash button 606 (see FIG. 6). The streaming spreadsheet will prompt for a name for this new stream (for example, Bargains), and will start sending this data to the server. The tick of the new stream is the union of the ticks of the feeds of which it is composed: that is, whenever one of the feeds is updated, a new tuple with all the data is sent to the server. Other streaming spreadsheet users and/or other stream consumers will then be able to subscribe to it. Since the data is computed in the spreadsheet, when the spreadsheet is closed, the stream will no longer be published to the server.

Step 7: Exporting Computation. When the user is ready to deploy the application, he or she can export the computation by pressing movie button 607. This feature takes a snapshot of all formulas in the entire spreadsheet and sends it to the server. Each spreadsheet has a single output stream (visible to other users). During export, the user selects the cells to be included as attributes of the output stream. Multiple exports result in separate snapshots at the server. Once computation is exported, it runs at the server side, and exists even after the user closes the spreadsheet. In some embodiments, there may be a trade-off between data and computation export: in data export, the user may compute new data locally using custom macros and libraries, but the computation disappears when the spreadsheet is closed; in computation export, only a subset of built-in spreadsheet features may be supported (at the server), but the computation persists beyond the life of the spreadsheet.

Supplementary Step: Working with State. In this extension to the above example, the user wants to keep count of the number of quotes that are bargains. Screenshot 1000 of FIG. 10 illustrates how this works. Cell I11 is set to 1 if there is a bargain, 0 otherwise. Cell I15 is set to the old bargain count plus cell I11, so it increments if and only if ("iff") there is a bargain. Cell I19 obtains the old bargain count by using the PRE function. Function PRE(v, t, $v_0$) is formalized below; intuitively, it obtains the previous value of v, using the tick of t, and using value $v_0$ as the default when v is not yet defined. Note that the bargain count computation is cyclic (the new count depends on the old count and vice versa). As will be described below, this is well defined as long as every cycle contains a call to PRE.

Note that whereas users of this streaming spreadsheet always have concrete data to look at, developing code in a streaming language feels more decoupled from the data. Furthermore, writing code in a streaming language requires familiarity with programming, which is arguably beyond the reach of an end-user without the investment of significant learning time. Compared to writing code, the streaming spreadsheet experience makes computing with streams accessible to the end-user. It provides a reactive programming model with a fixed control structure: new tuples cause dependent cells to be recomputed and refreshed. The user is freed to focus on the data and its transformations without having to think about unfamiliar programming language syntax. The interface makes it easy to express computations on a window of data from the same stream, and allows computation export for deployment. The spreadsheet also provides a variety of visualization possibilities. In the sample embodiment, for example, the user can create a line chart for the price (as shown, for example, in FIG. 9), and the chart is live as well.

C. Spreadsheet Calculus

The sample embodiment presented above includes a programming model supported by a core calculus. That core calculus is formalized here. Other embodiments may use other programming models and/or may be supported by other core calculi and/or other formal language semantics. First presented are the constructs and semantics of a minimal client spreadsheet—a collection of cells and formulas—connected to a server providing real-time data feeds. The constructs allow computation over recent feed histories and the building of stateful spreadsheets. The semantics define when and how cell values are computed. Proofs are then given to demonstrate that the resulting executions are well defined, reactive, and deterministic provided the client spreadsheet is free from immediate cyclic dependencies (subsection C.1).

Clients compute over potentially infinite data feeds. The programming model of the sample embodiment is intended to favor real-time analytics and prevent users from engaging in expensive querying of feed histories. For example, a client spreadsheet can compute the average of a data feed over time (since the beginning of time), but it must do so incrementally as the live data flows through the client. Executions in the sample programming model can be computed incrementally over time, using a bounded amount of computation per update (i.e., incoming data packet) and a bounded amount of memory to keep track of the execution state—the "past"—of size proportional to the client itself. This is formally established in subsection C.2.

The end-user can change formulas in the spreadsheet while real-time feeds are being processed. To support this form of live programming, the semantics are extended so that cells no longer contain static formulas, but feeds of formulas that change over time (subsection C.3).

The core calculus presented here is not intended as an actual programming interface for the end-user. To bridge this gap, a stream calculus is specified by reduction to the core calculus. It supports richer notions of data streams—sequences of tuples with named attributes—and formulas (subsection C.4).

Finally, a query language that provides familiar relational operators on data streams such as projection and selection is specified in subsection C.5.

C.1. Core Calculus

First definitions are given, then key properties of the core calculus are established.

Ticks.

Let a tick T be a possibly empty, at most countable, strictly increasing series of non-negative real numbers $\{t_0, t_1, t_2, \ldots\}$ representing a sequence of arrival times. T is unbounded if infinite.

$T \triangleright t$ is written for the tick T up to time t that is formally the series $T \cap [0, t]$, which is always a finite tick.

A non-empty finite tick T always admits a maximal element max(T). Given a finite tick T with at least two elements, prev(T) is defined as $\max(T \setminus \max(T))$.

$(t_0, t_1) \in T$ is written if $t_0$ and $t_1$ are two consecutive arrival times in T, that is, if $t_1 \in T$ and $t_0 = \text{prev}(T \triangleright t_1)$.

Feeds.

Let a feed $\phi$ be a map from a tick to values. Dom($\phi$) is written for the tick of $\phi$. It is said $\phi$ ticks at time t iff $t \in \text{dom}(\phi)$.

As a convenience, the notation $\phi(t)$ is overloaded as follows. If $t \in \text{dom}(\phi)$, then $\phi(t)$ is the usual function application. Otherwise, if $\text{dom}(\phi) \triangleright t \neq \emptyset$, then $\phi(t)$ is defined as $\phi(\max(\text{dom}(\phi) \triangleright t))$. Otherwise, $\phi(t)$ is undefined and $\phi(t) = \bot$ is written. In short, $\phi(t)$ is always the most recent value of $\phi$ at time t. In general, the notation $\bot$ is used to denote an undefined value ($\bot$ is not a value).

Servers.

Let a server S be a finite collection of feeds. The server tick N of S is defined as the tick $\bigcup_{\phi \in S} \text{dom}(\phi)$.

This calculus is reactive in the sense that everything happens in reaction to the ticks of the server feeds, hence at a time $t \in N$.

Because of the required properties of ticks, it makes sense to think of N as $\mathbb{N}$ or a subset of $\mathbb{N}$ if it helps the reader. While ticks are intended to model real-time arrival times, these semantics really think of arrival times as logical instants. The order matters, but the time difference between two instants does not.

Clients, Cells, and Formulas.

Let a client C be a finite collection of cells. Each cell has a unique name c and contains a formula f. We write $c \equiv f$ iff c contains formula f.

The syntax of formulas is defined as follows, where f denotes a formula, c a cell name, $\phi$ a server feed, and op a family of operators on values.

$f ::= \phi \mid op(c_1, \ldots, c_n) \mid \text{latch}(c_0, c_1) \mid \text{when}(c) \mid c_0 @ c_1$ For simplicity, this core calculus does not permit nesting constructs. The stream calculus of subsection C.4 lifts this restriction.

Constant formulas are not explicitly modeled as these can be obtained by means of constant server feeds. Observe that these semantics distinguish constant feeds with the same value but distinct ticks.

This core calculus is untyped. All op operators are assumed to be total functions. For simplicity, "eager" operators capable of producing values even if not all operands are defined are not considered here, but such operators could be added easily in other embodiments of the core calculus.

The calculus has two constructs to manipulate ticks: "when" and "@". The first one makes it possible to mask ticks according to a Boolean condition. The second samples a feed according to the tick of another feed. They are typically combined to permit downsampling a feed. Finally, the "latch" construct can delay a feed so that a feed value that is not the most recent can be accessed. These three constructs are discussed and illustrated below as their semantics are specified.

Well-Formedness.

The set of immediate dependencies deps(c) of a cell c are defined as follows:

$$deps(c) = \begin{cases} \emptyset & \text{if } c \equiv \phi \\ \{c_1, \ldots, c_n\} & \text{if } c \equiv op(c_1, \ldots, c_n) \\ \{c_1\} & \text{if } c \equiv \text{latch}(c_0, c_1) \\ \{c_0\} & \text{if } c \equiv \text{when}(c_0) \\ \{c_0, c_1\} & \text{if } c \equiv c_0 @ c_1 \end{cases}$$

The semantics here are such that if $c \equiv \text{latch}(c_0, c_1)$ then c only depends on the past of $c_0$, hence c does not immediately depend on $c_0$. Reciprocally, if c immediately depends on $c_0$ then the semantics of c at time t will potentially be derived from the semantics of $c_0$ at time t. Immediate dependencies need therefore be acyclic. A client is said to be well formed iff the directed graph $\mathcal{G}$ of immediate dependencies is acyclic, where the vertices of $\mathcal{G}$ are the cell names and there exists an edge (c, c') in $\mathcal{G}$ iff $c' \in \text{deps}(c)$.

In the sequel, all clients are required to be well formed. This will ensure that these semantics are well defined.

Semantics.

The tick $\mathcal{T}(c)$ of a cell c of a well-formed client C and the value $\mathcal{E}(c, t)$ of c at time $t \in [0, \infty[$ are defined by mutual recursion as follows, starting with $\mathcal{T}(c)$:

$$\mathcal{T}(c) = \begin{cases} \text{dom}(\phi) & \text{if } c \equiv \phi \\ \{t \in \bigcup_{i=1}^{n} \mathcal{T}(c_i) \mid \forall i \in \{1, \ldots, n\} : \mathcal{T}(c_i) \triangleright t \neq \emptyset\} & \text{if } c \equiv op(c_1, \ldots, c_n) \\ \mathcal{T}(c_1) & \text{if } c \equiv \text{latch}(c_0, c_1) \\ \{t \in \mathcal{T}(c_0) \mid \mathcal{E}(c_0, t) = \text{true}\} & \text{if } c \equiv \text{when}(c_0) \\ \{t \in \mathcal{T}(c_1) \mid \mathcal{T}(c_0) \triangleright t \neq \emptyset\} & \text{if } c \equiv c_0 @ c_1 \end{cases}$$

In contrast with synchronous programming models, here the operands of an operator are not required to be synchronous, that is, to share the same tick. Instead, an operator ticks each time an operand does (once all operands are defined).

The tick of $\text{latch}(c_0, c_1)$ is simply the tick of the second argument, $c_1$. The cell $c \equiv \text{when}(c_0)$ ticks when $c_0$ both ticks and evaluates to true. Once $c_0$ is defined, $c_0 @ c_1$ ticks when $c_1$ does.

The definition of $\mathcal{E}$ (c, t) is now considered:

$$\varepsilon(c,t) = \begin{cases} \phi(t) & \text{if } c \equiv \phi \\ op(\varepsilon(c_1,t),\ldots,\varepsilon(c_n,t)) & \text{if } c \equiv op(c_1,\ldots,c_n) \text{ and} \\ & \forall\, i{:}\varepsilon(c_i,t) \neq \bot \\ \varepsilon(c_0, prev(\mathcal{T}(c_1) \triangleright t)) & \text{if } c \equiv latch(c_0,c_1) \text{ and } |\mathcal{T}(c_1) \triangleright t| \geq 2 \\ & \text{and } \mathcal{T}(c_0) \triangleright prev(\mathcal{T}(c_1) \triangleright t) \neq \emptyset \\ \varepsilon(c_1,t) & \text{if } c \equiv latch(c_0,c_1) \text{ and } |\mathcal{T}(c_1) \triangleright t| \geq 2 \\ & \text{and } \mathcal{T}(c_0) \triangleright prev(\mathcal{T}(c_1) \triangleright t) = \emptyset \\ \varepsilon(c_1,t) & \text{if } c \equiv latch(c_0,c_1) \text{ and } |\mathcal{T}(c_1) \triangleright t| = 1 \\ true & \text{if } c \equiv when(c_0) \text{ and } \mathcal{T}(c) \triangleright t \neq \emptyset \\ \varepsilon(c_0, max(\mathcal{T}(c_1) \triangleright t)) & \text{if } c \equiv c_0 @ c_1 \\ \bot & \text{otherwise} \end{cases}$$

The semantics of operators lifts an operator from values to feeds by simply invoking the operator on the most recent value of each feed.

The formula $c_0 @ c_1$ produces the current value of $c_0$ when $c_1$ ticks. Moreover, "when" converts a Boolean feed into a tick. For instance, if a≡nat and b≡isEven(a) and c≡when (b) and d≡a@ c where nat is a server feed producing the natural integers and isEven a unary operator with the obvious semantics, then d only produces even integers. The arrival time of each integer in d is the same as the arrival time of the same integer in nat.

The formula $latch(c_0, c_1)$ provides for each tick of $c_1$ the value of $c_0$ recorded at the previous tick of $c_1$. But it defaults to the value of $c_1$ instead, if either this is the first tick of $c_1$ or $c_0$ was not yet defined when $c_1$ last ticked. Typically, $c_1$ will be a constant feed.

The "latch" construct serves a double purpose in this core calculus: (i) it makes stateful clients possible and (ii) it enables clients to reason about windows of data.

For an example of a stateful computation, suppose zero is the unary constant operator with value 0 and one is a sever feed with tick {0} and value 1. The cell e in client {a≡feed, b≡zero(a), c≡one, d≡c+e, e≡latch(d, b)} counts the number of ticks in the server feed feed. Observe that b, and hence e, ticks exactly when feed does. Moreover, the initial value of e is zero and each subsequent value of e is obtained by incrementing the previous value of e by one.

For a window example, suppose equal is a binary equality test operator. The cell c in client {a≡feed, b≡latch(a, a), c≡equal(a, b)} ticks when the server feed feed does and evaluates to true the first time and subsequently iff the current value of feed is equal to the previous value.

Observe that in the stateful example, the "latch" is used to form a cycle of cells, whereas in the window example, there is no such cycle. In the latter, the two arguments to "latch" can be the same (or in general share the same tick) whereas in the former, this would be illegal by definition of well formedness.

An alternative definition for the "latch" construct takes as arguments a cell c and a constant v. In this approach, "latch" is defined to tick when c does and to evaluate to the previous value of c except for the first tick, when it evaluates to v. This however severely complicates the use of "latch" for defining stateful computations as the tick definition becomes circular leading to poor interactions between "latch," "when," and @. (For a paradox, consider the client {a≡latch(d, true), b≡FALSE, c≡when(a), d≡b@c}, where FALSE is an infinite feed of false values.) While this could be addressed by means of a stratified well-formedness condition, there is value in the simplicity obtained by forcing "latch" to resample. Ultimately, various embodiments of the stream calculus and query language can wrap and expose "latch" in a variety of ways more palatable to the end-user.

Lemma 1 (Soundness). For a well-formed client C, the tick and values of all cells are well defined at all times.

Proof. Let depth(c) be the length of the longest path in $\mathcal{G}$ with source c. For a cell c∈C and time t∈[0, ∞[, the expression σ(c, t)∈N×ℕ is defined as follows:

$$\sigma(c,t) = (\max(\mathbb{N} \triangleright t), depth(c))$$

The lexicographic order ≤ of N×ℕ is well founded.

The definition of $\mathcal{T}$ (c) can be rewritten as a definition of $\mathcal{T}$ (c)▷ t so that every tick instance of the right-hand side is only needed up to time t. In the definition of $\mathcal{E}$ (c, t), occurrences of T(c)▷ t can be expanded into its definition.

The recursive co-definition of $\mathcal{T}$ (c)▷ t and $\mathcal{E}$ (c, t) is now established to be well founded using (σ, ≤) to order the tuples (c, t)∈N×ℕ.

In all induction cases except for the definition of $\mathcal{E}$ (latch $(c_0, c_1)$, t), the terms of the right-hand side are only concerned with time up to t and cells of strictly lower depth. Moreover, the tick up to t and value at t of the cell c with formula c≡latch($c_0, c_1$) are defined using $\mathcal{T}$ ($c_1$)▷ t and $\mathcal{E}$ ($c_1$, t) (same time, strictly lower depth) and possibly $\mathcal{T}$ ($c_0$)▷ $t_0$ and $\mathcal{E}$ ($c_0, t_0$) with $t_0$ such that max($\mathbb{N} \triangleright t_0$)<max($\mathbb{N} \triangleright t$).

Corollary 1 (Determinism). The tick and values of a cell are uniquely defined at all times.

Lemma 2 (Reactivity). For all c∈C, $\mathcal{T}$ (c)⊆N. For all t∈[0, ∞[, the value of c∈C at time t is equal to the value of c at the most recent arrival time, if any, or is undefined: if $\mathcal{T}$ (c)▷ t≠∅ then $\mathcal{E}$ (c, t)=$\mathcal{E}$ (c, max($\mathcal{T}$ (c)▷ t)) else $\mathcal{E}$ (c, t)=⊥.

Proof. By induction over the depth of the cell.

A cell c thus defines a client feed $\overset{\triangleright}{c}$ with tick dom($\overset{\triangleright}{c}$)= $\mathcal{T}$ (c) and values $\overset{\triangleright}{c}$ :t↦ $\mathcal{E}$ (c, t).

C.2. Boundedness

Because of "latch," the values of the cell at time t are defined using past values of cells and feeds. But a careful look at the definitions shows that the dependency on past values is bounded. Concretely, c≡latch($c_0, c_1$) only needs to retain one value of $c_0$ at a time (in addition to the current value of c). Formally, for all c∈C and t∈N, $\mathcal{H}$ (c, t) is defined as:

$$\mathcal{H}(c,t) = \begin{cases} \varepsilon(c_0, \max(\mathcal{T}(c_1) \triangleright t)) & \text{if } c \equiv latch(c_0,c_1) \text{ and } \max(\mathcal{T}(c_1) \triangleright t) \neq \bot \\ \bot & \text{otherwise} \end{cases}$$

Lemma 3 (Boundedness). For all ($t_0$, t)∈N, the values of $\mathcal{H}$ and $\mathcal{E}$ at time t for each c∈C can be computed as a function of $\mathcal{H}$ and $\mathcal{E}$ at time $t_0$ and the ticks and values of the server feeds at time t.

Proof. We observe that we can rewrite the semantics of the core calculus as follows:

$$t \in \mathcal{T}(c) \iff \begin{cases} t \in dom(\phi) & \text{if } c \equiv \phi \\ (\exists\, i{:}t \in \mathcal{T}(c_i)) \wedge (\forall\, i{:}\varepsilon(c_i,t) \neq \bot) & \text{if } c \equiv op(c_1,\ldots,c_n) \\ t \in \mathcal{T}(c_1) & \text{if } c \equiv latch(c_0,c_1) \\ t \in \mathcal{T}(c_0) \wedge \varepsilon(c_0,t) = true & \text{if } c \equiv when(c_0) \\ t \in \mathcal{T}(c_1) \wedge \varepsilon(c_0,t) \neq \bot & \text{if } c \equiv c_0 @ c_1 \end{cases}$$

If $t \notin T(c)$ then $\mathcal{H}(c, t) = \mathcal{H}(c, t_0)$ and $\mathcal{E}(c, t) = \mathcal{E}(c, t_0)$. Otherwise, $\mathcal{H}(c, t) = \mathcal{E}(c_0, t)$ if $c \equiv \text{latch}(c_0, c_1)$ or $\bot$ if not, and $$\varepsilon(c, t) = \begin{cases} \phi(t) & \text{if } c \equiv \phi \\ op(\varepsilon(c_1, t), \ldots, \varepsilon(c_n, t)) & \text{if } c \equiv op(c_1, \ldots, c_n) \text{ and } \forall : \varepsilon(c_i, t) \neq \bot \\ \mathcal{H}(c, t_0) & \text{if } c \equiv \text{latch}(c_0, c_1) \text{ and } \mathcal{H}(c, t_0) \neq \bot \\ \varepsilon(c_1, t) & \text{if } c \equiv \text{latch}(c_0, c_1) \text{ and } \mathcal{H}(c, t_0) = \bot \\ \text{true} & \text{if } c \equiv \text{when}(c_0) \\ \varepsilon(c_0, t) & \text{if } c \equiv c_0 @ c_1 \\ \bot & \text{otherwise} \end{cases}$$

By induction using the well-foundedness argument of Lemma 1, the two semantics define the same tick and values for all cells at all times.

In summary, storing one value for each occurrence of "latch" enables the incremental computation of these semantics over time. In particular, the memory required is bounded by the client size. Moreover, the amount of computation per tick is also bounded by the client size (assuming unit cost for the operators op).

C.3. Live Calculus

The semantics of live clients are now defined, where cell formulas are permitted to evolve over time. While neither cell creation nor deletion is modeled explicitly, cells are permitted to be initially empty.

We now suppose that each cell $c \in C$ has a feed of formulas $\hat{c}$ with tick $dom(\hat{c})$ and formula $\hat{c}(t)$ at time t.

The immediate dependencies of cell c at time t is defined as follows:

$$deps(c) = \begin{cases} \emptyset & \text{if } \hat{c}(t) = \phi \\ \{c_1, \ldots, c_n\} & \text{if } \hat{c}(t) = op(c_1, \ldots, c_n) \\ \{c_1\} & \text{if } \hat{c}(t) = \text{latch}(c_0, c_1) \\ \{c_0\} & \text{if } \hat{c}(t) = \text{when}(c_0) \\ \{c_0, c_1\} & \text{if } \hat{c}(t) = c_0 @ c_1 \end{cases}$$

A client is said to be well-formed if the graph of immediate cell dependencies is acyclic at all times.

The tick of a cell c around time t is defined using the formula $\hat{c}(t)$ as follows:

$$\mathcal{T}(c, t) = \begin{cases} dom(\phi) & \text{if } \hat{c}(t) = \phi \\ \{t \in \bigcup_{i=1}^{n} \mathcal{T}(c_i) \mid \forall i \in \{1, \ldots, n\} : \mathcal{T}(c_i) \triangleright t \neq \emptyset\} & \text{if } \hat{c}(t) = op(c_1, \ldots, c_n) \\ \mathcal{T}(c_1) & \text{if } \hat{c}(t) = \text{latch}(c_0, c_1) \\ \{t \in \mathcal{T}(c_0) \mid \varepsilon(c_0, t) = \text{true}\} & \text{if } \hat{c}(t) = \text{when}(c_0) \\ \{t \in \mathcal{T}(c_1) \mid \mathcal{T}(c_0) \triangleright t \neq \emptyset\} & \text{if } \hat{c}(t) = c_0 @ c_1 \end{cases}$$

The tick of cell c is defined by concatenating the ticks of its successive formulas over time. By convention, a cell also ticks when its formula feed does.

$$\mathcal{T}(c) = dom(\hat{c}) \cup \bigcup_{(t_0, t_1) \in dom(\hat{c})} (\mathcal{T}(\hat{c}(t_0), t_0) \cap [t_0, t_1]) \cup$$

-continued $$\bigcup_{t_0 = max(dom(\hat{c}))} (\mathcal{T}(\hat{c}(t_0), t_0) \cap [t_0, \infty])$$

The last term in this union handles the case of a finite formula feed.

The value of cell c at time t is defined using the current formula $\hat{c}(t)$.

$$\varepsilon(c, t) = \begin{cases} \phi(t) & \text{if } \hat{c}(t) = \phi \\ op(\varepsilon(c_1, t), \ldots, \varepsilon(c_n, t)) & \text{if } \hat{c}(t) = op(c_1, \ldots, c_n) \text{ and } \forall i : \varepsilon(c_i, t) \neq \bot \\ \varepsilon(c_0, prev(\mathcal{T}(c_1) \triangleright t)) & \begin{array}{l}\text{if } \hat{c}(t) = \text{latch}(c_0, c_1) \text{ and } \mathcal{T}(c_1) \triangleright t > \\ max(dom(\hat{c})) \text{ and } \mathcal{T}(c_0) \triangleright \\ prev(\mathcal{T}(c_1) \triangleright t) \neq \emptyset\end{array} \\ \varepsilon(c_1, t) & \begin{array}{l}\text{if } \hat{c}(t) = \text{latch}(c_0, c_1) \text{ and } \mathcal{T}(c_1) \triangleright t > \\ max(dom(\hat{c})) \text{ and } \mathcal{T}(c_0) \triangleright \\ prev(\mathcal{T}(c_1) \triangleright t) = \emptyset\end{array} \\ \varepsilon(c_1, t) & \begin{array}{l}\text{if } \hat{c}(t) = \text{latch}(c_0, c_1) \text{ and } \\ \mathcal{T}(c_1) \triangleright t = max(dom(\hat{c}))\end{array} \\ \text{true} & \text{if } \hat{c}(t) = \text{when}(c_0) \text{ and } \mathcal{T}(c) \triangleright t \neq \emptyset \\ \varepsilon(c_0, max(\mathcal{T}(c) \triangleright t)) & \text{if } \hat{c}(t) = c_0 @ c_1 \text{ and } \mathcal{T}(c) \triangleright t \neq \emptyset \\ \bot & \text{otherwise} \end{cases}$$

These definitions follow from the core calculus except for one complication. If $\hat{c}(t) = \text{latch}(c_0, c_1)$ then $\mathcal{E}(c, t)$ may only depend on values of $c_0$ since the last tick of $\hat{c}$. Intuitively, a recently introduced "latch" cannot request values that predate its introduction. This ensures that these semantics are still well defined and incrementally computable in the sense of the previous subsection.

C.4. Stream Calculus

The core calculus presented here is not intended as an actual programming interface for the end-user. In this subsection, this calculus is enriched with higher-level notions of streams and formulas. A stream is a sequence of tuples with named attributes. Nesting constructs in formulas and handling constant values is permitted.

For simplicity, the presentation returns to the fixed formulas of the core calculus, but the techniques of subsection C.3 remain applicable here.

Streams.

Two feeds are said to be synchronous if they have the same tick. A stream s is defined to be a non-empty collection of synchronous feeds. The feeds in a stream are labeled with attributes. Given a stream s, s.a denotes the feed of s labeled a. The set of attributes of s is denoted $\mathcal{A}(s)$.

Semantics. A calculus over streams is now defined by reduction to the core calculus of subsection C.1. The syntax of formulas is as follows, where v stands for a constant value:

$$f ::= v \mid c \mid op(f_1, \ldots, f_n) \mid \text{latch}(f_0, f_1) \mid \text{pre}(f_0, f_1, v) \mid \text{when}(f_0)$$
$$\mid f_0 @ f_1 \mid s.a$$

Constructs can be nested. Formula v denotes a feed with value v and tick $\{0\}$. Formula $\text{pre}(f_0, f_1, v)$ is a syntactic shortcut for $\text{latch}(f_0, \text{first}(v, f_1))$ where the "first" operator maps $(x, y)$ to $x$. Therefore, $\text{first}(v, f_1)$ produces a constant feed of values v with tick $\mathcal{T}$ (h).

Let C be a client in the stream calculus. The semantics of C are defined here by constructing a client C' in the core calculus. In particular, C is specified to be well formed iff C' is. The semantics of a cell c in C is specified as the semantics of the cell c in C', that is, the cell with the same name in the reduced client.

Intuitively, the reduced client is simply defined by introducing helper cells for every subformula and replacing subformulas with references to these helper cells. Concretely, we specify by induction over the structure of formulas, a reduction $\mathcal{R}$ that maps a cell c with formula f in the stream language to a fragment of a client in the core language, that is, one or more cells with their respective formulas in the core language. All cells but c itself in each map are fresh, that is, have globally unique names.

The reduced client C' of C is then simply the union of these fragments for each cell c in C.

$\mathcal{R}(c, f) =$ $$\begin{cases} \{c \mapsto v\} & \text{if } f = v \\ \{c \mapsto c_0\} & \text{if } f = c_0 \\ \{c \mapsto op(c_1, \ldots, c_n)\} \cup \bigcup_{i=1}^{n} \mathcal{R}(c_i, f_i) & \text{if } f = op(f_1, \ldots, f_n) \\ \{c \mapsto \text{latch}(c_0, c_1)\} \cup \mathcal{R}(c_0, f_0) \cup \mathcal{R}(c_1, f_1) & \text{if } f = \text{latch}(f_0, f_1) \\ \{c \mapsto \text{when}(c_0)\} \cup \mathcal{R}(c_0, f_0) & \text{if } f = \text{when}(f_0) \\ \{c \mapsto c_0 @ c_1\} \cup \mathcal{R}(c_0, f_0) \cup \mathcal{R}(c_1, f_1) & \text{if } f = f_0 @ f_1 \\ \{c \mapsto s, a\} & \text{if } f = s, a \end{cases}$$

C.5. Query Language

The stream calculus assumes a programming model where the user modifies one cell at a time, defining one value feed at a time. In contrast, the query language of the streaming spreadsheet embodiment presented earlier allows the user to enter formulas in a range of cells at once by defining a stream with multiple attributes and a window over this stream history, all in a single step. Moreover, this query language provides higher-level mechanisms to process streams inspired from relational operators—emphasizing relations and deemphasizing arrival times. In this section, a basic query language over streams is specified, and how it reduces to the stream calculus is shown. This basic query language consists of projection and selection operators.

The query language implemented in the streaming spreadsheet embodiment presented earlier also supports other traditional relational operators such as sort, pivot, aggregate, and deduplicate. Some conventional spreadsheets have native features that support static versions of some of these constructs (sort, pivot); the query language of the streaming spreadsheet complements these features with live ones.

The query language is tightly integrated with the user interface. In particular, the number of rows in the target range of a query defines the length of the stream history to preserve. However, this coupling is not modeled here.

Queries.

The syntax of queries is defined as follows, where q denotes a query, s a stream, a an attribute, and f a formula in the stream calculus:

$$q ::= s$$
$$\mid q \text{ as } s$$
$$\mid \text{project}(q, a_1 = f_1, \ldots, a_n = f_n)$$
$$\mid \text{select}(q, f)$$

Queries construct anonymous streams. The query "q as s" binds the stream constructed by q to the stream name s. This binding is global, that is, these names are meant to be distinct from each other and distinct from the names of the server streams. The ability to name the streams produced by subqueries is valuable in practice, hence the ad hoc "local-global" binding semantics, where locally-bound names are globally scoped. However, some embodiments of the present invention may not include global binding or scoping.

The "project" construct defines a new stream with attributes $a_1$ through $a_n$, with formulas $f_1$ through $f_n$, respectively, allowing the user to synchronize a collection of feeds to produce a stream: the values of $f_1$ through $f_n$ are sampled according to the tick of q (the first parameter of "project") and assigned to the attributes of the resulting stream.

The "select" construct defines a new stream with all the attributes of query q, but with tuples that have been filtered according to the Boolean formula f.

Semantics.

A client (C, Q) in the query language combines a client C in the stream calculus—a finite collection of cells and formulas—and a finite collection of queries Q.

To simplify the formalization, it is assumed that each stream constructed in Q—each client stream—is named: that is, each query or subquery in Q is labeled with a globally unique stream name s. The query associated with name s is written as $q_s$. Of course, the queries are labeled "s" or "q as s" with name s. The set of all the client streams is denoted by W.

The attributes $\mathcal{A}$ (s) of s in W are defined as follows:

$$\mathcal{A}(s) = \begin{cases} \mathcal{A}(s') & \text{if } q_s = s' \\ \{a_1, \ldots, a_n\} & \text{if } q_s = \text{project}(q_0, a_1 = f_1, \ldots, a_n = f_n) \\ \mathcal{A}(s') & \text{if } q_s = q'_{s'} \text{ as } s \text{ or } q_s = \text{select}(q'_{s'}, f) \end{cases}$$

Each attribute a of each client stream s is mapped to a fresh cell in C' denoted $c_s^a$. A reduction from a query $q_s$ to a collection of cells C (s) is defined by induction on the structure of queries as follows:

$$C(s) = \begin{cases} \bigcup_{a \in \mathcal{A}(s)} \{c_s^a \mapsto s', a\} & \text{if } q_s = s' \text{ and } s' \in \mathcal{S} \\ \bigcup_{a \in \mathcal{A}(s)} \{c_s^a \mapsto c_{s'}^a\} & \text{if } q_s = s' \text{ and } s' \in W \\ C(s') \cup \bigcup_{a \in \mathcal{A}(s)} \{c_s^a \mapsto c_{s'}^a\} & \text{if } q_s = q'_{s'} \text{ as } s \\ C(s') \cup \bigcup_{i=1}^{n} \{c_s^{a_i} \mapsto nth(i, f_1, \ldots, f_n) @ c_{s'}^{a'}\} & \text{if } q_s = \text{project}(q'_{s'}, a_1 = f_1, \ldots, a_n = f_n) \\ & \quad \text{and } a' \in \mathcal{A}(s') \\ C(s') \cup \bigcup_{a \in \mathcal{A}(s)} \{c_s^a \mapsto c_{s'}^a @ \text{when}(f)\} & \text{if } q_s = \text{select}(q'_{s'}, f) \end{cases}$$

The encoding of "select" is straightforward. The "project" construct is trickier. The point is to resample each $f_i$ using the tick of $q'_{s'}$, which can be obtained from any of its attributes. But all $f_i$ should be defined before emitting a value for any attribute. Therefore, all the $f_i$ are combined together using operator nth: $(i, a_1, \ldots, a_n) \mapsto a_i$. Like any operator lifted to feeds, it only starts ticking once all arguments are defined.

The reduced client C' is obtained as $C \cup \bigcup_{s \in W} C(s)$. $(C, Q)$ is specified as being well formed if C' is.

D. Architecture

Some embodiments of the present invention are implemented as a client-server architecture. The client in some client-server embodiments may include one, or more, of the following features, characteristics and/or advantages: (i) is a thin layer that implements minimal functionality by design; (ii) may be easily repurposed for integration with multiple spreadsheet frontends; (iii) is integrated with a conventional spreadsheet application; and/or (iv) interacts with a server via a representational state transfer (RESTful) interface that provides an API to (a) discover available streams, (b) subscribe to streams, (c) create feeds, (d) export data and/or (e) export computation.

Figure 11:
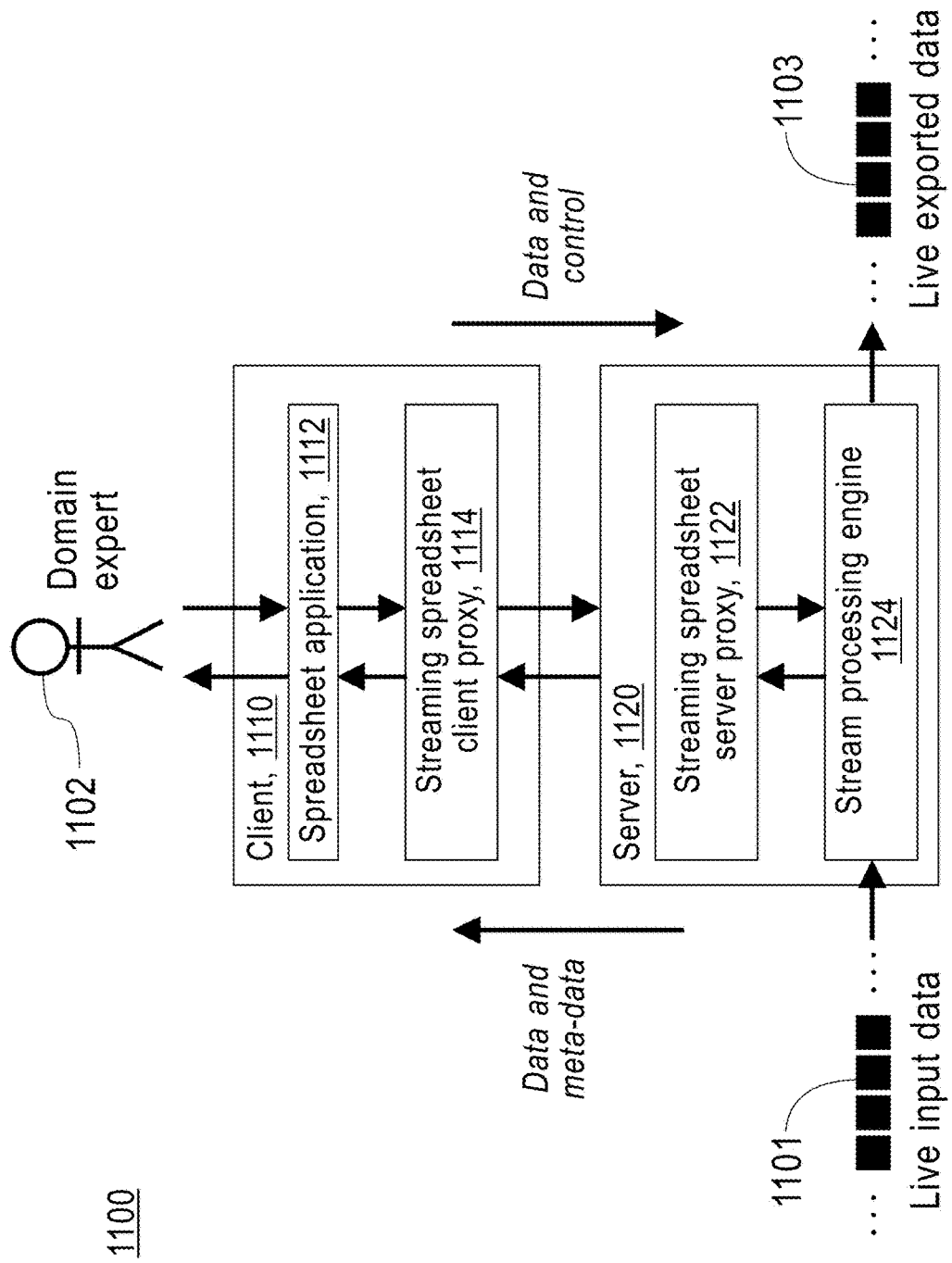
FIG. 11 is a block diagram view of a fifth embodiment system.

Shown in FIG. 11 is diagram 1100, depicting a sketch of the overall system architecture of an embodiment of the present invention. Diagram 1100 includes: live input data 1101; domain expert 1102; live exported data 1103; client 1110, including spreadsheet application 1112 and streaming spreadsheet client proxy 1114; and server 1120, including streaming spreadsheet server proxy 1122 and stream processing engine 1124. Data and meta-data flow from server 1120 to client 1110, while data and control information flow from client 1110 to server 1120.

The client in FIG. 11 consists of two components. The first is client proxy 1114. It encapsulates frontend-independent functionality including a session manager and a real-time data service that continuously updates the cells in spreadsheet application 1112 when ticks advance. The second is the frontend user interface and integration with spreadsheet application 1112. An embodiment of a client user interface and some of its features were described earlier in subsection B.

In some implementations: (i) the client proxy may be written in a well-known, object-oriented programming language; (ii) the user interface frontend may be composed of a collection of application macros; (iii) the client proxy may implement a real-time data server interface to communicate with the spreadsheet; and/or (iv) the client proxy may run as a shared library plug-in inside a spreadsheet. Implementing a real-time data server interface makes it possible for the client proxy to notify the spreadsheet that new data is available and for the spreadsheet to asynchronously pull the data from the client proxy. The client proxy therefore acts as a buffer between the streaming spreadsheet server and the spreadsheet in such implementations.

The server in FIG. 11 is composed of server proxy 1122 and stream processing engine 1124. The former implements the primary functionality while the latter is used to deploy generated stream processors when the client exports computation. Though not shown in the Figure, server-side proxy 1122 includes: (i) a name manager; (ii) a query processor; and (iii) a spreadsheet compiler. These features of the FIG. 11 embodiment will be discussed next.

The name manager maintains a directory of client connections and dispatches client requests to dedicated handlers. When a query is received that subscribes a client to a particular stream, the name manager allocates a dedicated handler to service the request. The handler persists as long as the client connection is maintained. In some implementations, the name manager: (i) is written in a well-known object-oriented programming language; (ii) is based on an actor-based system for highly concurrent and event-driven applications; and/or (iii) is conceptually a message-driven runtime, where actors execute when messages are received, producing new messages that are consumed by subsequent actors or pushed to the client. Actors in the FIG. 11 embodiment of the streaming spreadsheet system input tuples from existing streams, parse and reformat the tuples if necessary, and output the resulting tuples as new messages that are dispatched to registered listeners (e.g., clients). Data that is exported from the spreadsheet is handled by the name manager.

The query processor is an actor that applies a given set of transformations to a sequence of input tuples. The query is received from the client as a string, parsed on the server, and interpreted accordingly. All of the query operators described in subsection C.5 are supported. The operators are applied sequentially in the order implied by the programmer, although the order of application is amenable to optimizations in some embodiments, since some operators may be commutative and thus optimizations may reduce the amount of computation applied to any given tuple.

The spreadsheet compiler is responsible for handling exported computation. It parses the spreadsheets and builds a dependence graph between the cells, which in turn is used to derive a computational circuit for the spreadsheet. Terminal cells which have no incoming edges in the dependence graph are input signals, whereas those which have no outgoing edges in the dependence graph are output signals. Internal cells contain formulas that correspond to gates in the circuit, with input wires flowing from and output wires flowing to other cells as in the dependence graph. One circuit is created for each exported spreadsheet, and it is encapsulated within a single actor that will update the output signals as new ticks arrive. Output signals are visible to other users as new streams. The computation on the server persists even if the spreadsheet is no longer running.

E. Example Applications

Some embodiments of the present invention lend themselves to use for a wide range of stream processing applications. A few examples of the kinds of streaming computations that can be implemented in a streaming spreadsheet are presented here. The examples are drawn from a variety of domains (commerce, transportation, infrastructure, and security), and illustrate how some of the features of a streaming spreadsheet can play out in practice. FIGS. 12 through 15 show streaming spreadsheet screenshots 1200, 1300, 1400, and 1500 for the examples.

Decision Table.

Consider a commerce application where the input is a stream of persons (with name and age category), and the output is a stream of ticket prices. The ticket prices are obtained by looking them up in a table indexed by the age category (child, student, senior, or regular). Such tables are natural to express in spreadsheets, more so than in traditional text-based languages. The example in FIG. 12 looks up the ticket price for Bob, who is a student, and must thus pay $10. One requirement this use case illustrates is that besides single-cell references, it is helpful to support range-references, which refer to a rectangular region comprising multiple rows and columns. Some embodiments of the streaming spreadsheet calculus model range references via n-ary functions. Because some conventional spreadsheet applications offer stateless lookup functions for table lookup, such lookup operators need not be baked into the calculus for embodiments that incorporate these conventional spreadsheet applications. Variations on the decision-table case study could use relative lookup instead of absolute lookup, for instance, when the age is given as an integer instead of as a category.

Recency-Weighted Average.

Figure 13:
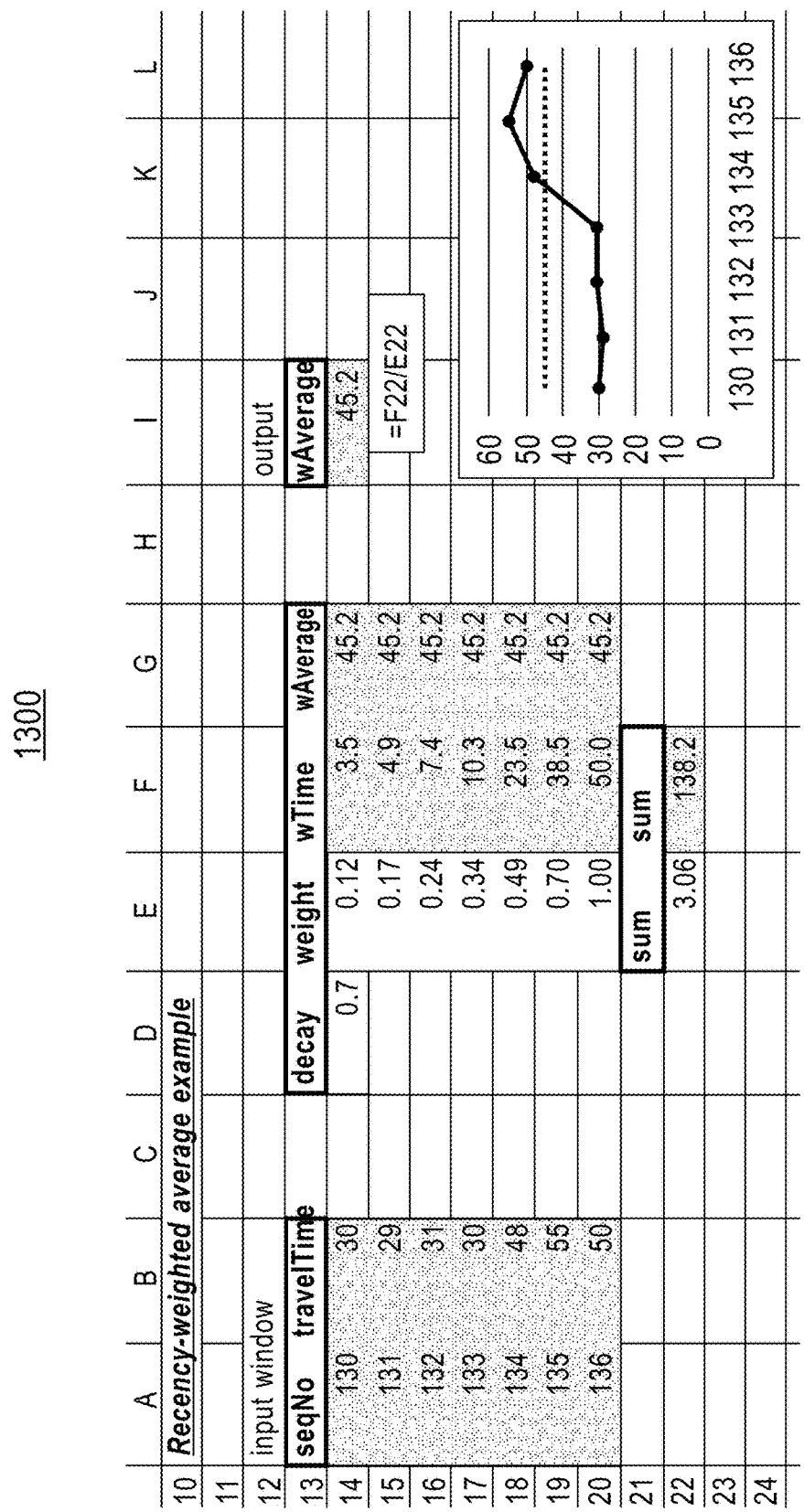
FIG. 13 is a screenshot view of a seventh embodiment system.
Figure 14:
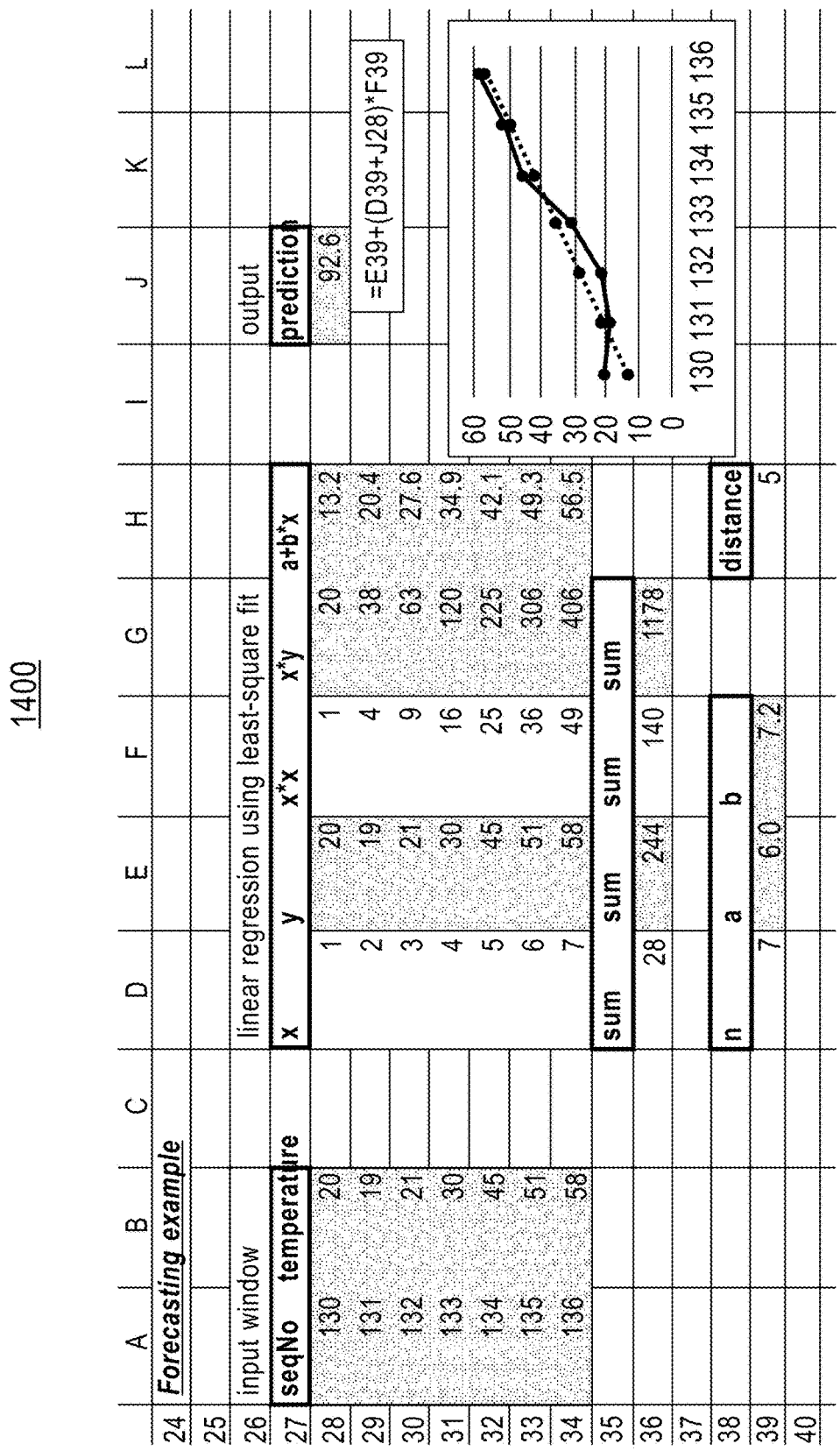
FIG. 14 is a screenshot view of a eighth embodiment system.

Consider a transportation application where the input is a stream of travel times between two landmarks, and the output is a stream of travel time estimates between the same landmarks. To estimate travel time in current traffic, the most recent input samples should count the most in the estimation. This can be accomplished by weighting the window with a decay curve. In FIG. 13, the most recent travel time is in cell B20, and the cells above it use PRE to get earlier readings. Cell D14 species the decay factor with the constant 0.7. In many traditional streaming languages, windows are high-level and opaque, supporting only a fixed set of built-in aggregations such as sum, min, max, or average. However, this use-case requires associative access on window contents. In a spreadsheet, this is natural to do, since the window contents are laid out in a range of cells, offering users full viewing and manipulation power. Variations of this use case could take additional information into account, such as the day of the week.

Forecasting.

Consider an infrastructure application where the input is a stream of temperature readings in a data center, and the output is a stream of predictions for future temperature readings based on the current trend. A spreadsheet can implement this by calculating a least-square fit over the recent readings, then extending the resulting curve into the future for forecasts. The example in FIG. 14 extends the temperature trend by a distance of 5 steps into the future, and predicts that it will reach a dangerous 92.6° Fahrenheit. Such forecasting algorithms are not that easy to get right, and a spreadsheet can help with debugging, because the developer can visualize the curve and the prediction interactively. This use case does not pose any additional requirements on the calculus, as it suffices to offer associative history access like in the case with recency-weighted average. As a variation, instead of predicting the temperature at a fixed distance in the future, the application could predict how long it would take to reach a fixed threshold value (say, 100° Fahrenheit). This could be used for an evacuation count-down.

State Machine.

Consider a security application where the input is a stream of activities at a tourist attraction, and the output is a stream of suspicious events that ought to be checked out by authorities. An example of a suspicious event would be when a person approaches the tourist attraction, drops a bag, and then leaves the attraction without taking the bag. This is easy to specify via a deterministic finite automaton (DFA). A spreadsheet can implement a DFA via a transition table indexed by the previous state and the current activity, to yield the next state and an output. Just like a decision table, a DFA transition table can be naturally represented by a block of cells in a spreadsheet. As cell I45 in FIG. 15 illustrates, the lookup in this case is two-dimensional, using a vertical lookup in combination with a horizontal one. As far as the calculus is concerned, this use case combines a need for a decision table with the need for history access. But in contrast to windows, which use PRE on input streams only, here the old state in cell G51 comes from using PRE on the current state in cell I45, which is itself computed. Besides this security application, state machines are also useful in other stream processing domains, such as for detecting M-shape patterns in streams of stock quotes.

F. Conclusion

Some embodiments of the present invention may include one, or more, of the following features, characteristics and/or advantages: (i) function at the intersection of spreadsheet programming and stream processing; (ii) use spreadsheets as a programming platform; (iii) are motivated by a desire to offer an interactive programming experience, where changes to code have immediate visible effects; (iv) do not require a user to know any conventional programming language; (v) tackle stream processing generally; (vi) export computations from a spreadsheet; (vii) export data and/or code from a spreadsheet for use in stream processing and/or consumption; (viii) allow a user to describe the desired analytics directly using the built-in computation features of a conventional spreadsheet; (ix) do not require programmers to learn a new language; (x) leverage a large user base from existing products; (xi) do not come with a learning curve hindering wide-spread adoption; (xii) are intended to be accessible to non-programmer end-users; and/or (xiii) offer considerable control over the streaming application that comes out in the end.

In some embodiments of the present invention, the formalized core calculus—choice of constructs, semantics, and properties—may include one, or more, of the following features, characteristics and/or advantages: (i) adopts the synchrony hypothesis: outputs are produced instantly so that inputs and outputs are formally synchronous; (ii) has ticks but not clocks: arrival times are not required to be periodic or regular; (iii) is asynchronous, in that its constructs can compose arbitrary feeds irrespective of their relative arrival times (feeds are implicitly sampled, or re-clocked, when not in sync; as a consequence, there is no need for a clock calculus to ensure proper pairing and boundedness); (iv) permits cyclic definitions while still guaranteeing causality, such as ensuring causality by preventing timing cycles and making sure every value cycle includes a delay (a latch); (v)

includes filtering; and/or (vi) breaks timing cycles by explicitly clocking latches—separating the input tick from the input value—rather than by introducing a delay in the "when" or "@" construct, akin to delaying the reaction to absence in reactive programming models.

Some embodiments of the present invention recognize the following facts, potential problems and/or potential areas for improvement with respect to the current state of the art: (i) stream processing has gained importance as many businesses have continuous data feeds, and analyzing these on-the-fly helps find opportunities and avoid risks; (ii) using a spreadsheet makes streaming accessible to the end-user; and/or (iii) a spreadsheet offers a very hands-on experience, because the data is manipulated directly where the user can see it, and interactive code changes have immediate visible effects.

Some embodiments of the present invention may include one, or more, of the following features, characteristics and/or advantages: (i) a system for visualizing and programming live streams in a spreadsheet; (ii) formalized semantics; (iii) a conventional spreadsheet application as the client frontend; (iv) the ability for a user to elect to export either data or computation when the user programs a streaming application; (v) exported data that can be further processed by the server, or can be used to initiate actions, such as alerts or sales; (vi) exported computation that can run directly on the server; (vii) exported computation that can live on even when the client is closed; (viii) the ability to save the cost of communicating with the client by running exported computation on the server; (ix) exported computation that can be optimized and compiled to machine code; and/or (x) the ability to enable end users to author powerful and efficient streaming applications using familiar spreadsheet features.

IV. DEFINITIONS

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Receive/provide/send/input/output: unless otherwise explicitly specified, these words should not be taken to imply: (i) any particular degree of directness with respect to the relationship between their objects and subjects; and/or (ii) absence of intermediate components, actions and/or things interposed between their objects and subjects.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

Spreadsheet: a visual representation of data in tabular, matrix, or mathematical graph form, where each cell, element, or node holds a data item and each dependent cell, element, or node is designed to be visually associated with a formula or other mechanism for deriving that data item from the data item(s) in one or more other cells, elements, or nodes.

Data stream, stream: a "live" source of synchronized data that, at least from the perspective of the data consumer, automatically updates as new data arrives; may or may not have any definite beginning or end; typically supplies only the most recent set or sets of values at any given time.

Rate-based rate manipulation: updating a computation (that is, producing a new value, whether or not the same as the prior value) based on the rate of a stream; for example "recalculate this formula when new data arrives in Cell A;" can be used in conjunction with value-based rate manipulation.

Value-based rate manipulation: updating a computation based on the incoming value of an attribute of a stream; for example "recalculate this formula only when the value of Cell A changes and is greater than 100;" can be used in conjunction with rate-based rate manipulation (for instance, "recalculate this formula only when the value in Cell A changes and is greater than 100 and when new data arrives in Cell B").

Well-specified timing semantics: an unambiguous expression of a relationship between an update of data (whether or not the value of the data changes) in a first cell and an update of data in a second cell; non-limiting examples include: (i) updating data in a first cell at the time data is updated in a second cell regardless of the value of the data in the second cell; (ii) updating data in a first cell at the time a second cell is updated based whether or not the new value of the data in the second cell meets specified criteria; and/or (iii) updating data in a first cell at the time a second cell is updated based on the old value of the data in the second cell; expressions from the same category and/or from different categories can be combined to form expressions of arbitrary complexity.

Circuit, digital circuit: A hardware construct, or a software representation thereof, that takes a set of discrete-valued inputs and transforms them into a set of discrete-valued outputs; a circuit may be combinatorial, where the output is a pure function of the present input only, or sequential, where the output depends not only on the present input but also on the history of the input, in which case a flip-flop, or latch, is typically used as a memory element for retaining information about input history, or state; if sequential, a circuit may be either synchronous, where the state of the circuit changes only at discrete times in response to a dedicated clock signal, or asynchronous, where the state of the circuit can change at any time in response to changing inputs.

What is claimed is:

1. A method comprising:
providing a computer-implemented spreadsheet program;
accepting instructions from a user, through a formula language of the spreadsheet program, corresponding to transformations of data input into one or more input cells into data output into one or more output cells;

storing the instructions as a circuit representation that can be used to perform the transformations of the input data into the output data independently of the spreadsheet program;

receiving a set of input data;

transforming the input data, via the circuit representation running independently of the spreadsheet program, into a set of output data; and outputting the set of output data wherein:

the set of input data includes a first input data stream and the set of output data includes a first output data stream; and the formula language includes both typical combinatorial spreadsheet operators and operators for articulating well-specified timing semantics for relationships between and/or among cells.

2. The method of claim 1 wherein the timing semantics include support for: (i) rate-based rate manipulation, (ii) value-based rate manipulation, and (iii) access to past cell values.

3. A computer program product comprising a computer readable storage medium having stored thereon:

first program instructions programmed to provide a computer-implemented spreadsheet program;

second program instructions programmed to accept instructions from a user, through a formula language of the spreadsheet program, corresponding to transformations of data input into one or more input cells into data output into one or more output cells;

third program instructions programmed to store the instructions as a circuit representation that can be used to perform the transformations of the input data into the output data independently of the spreadsheet program;

fourth program instructions programmed to receive a set of input data;

fifth program instructions programmed to transform the input data, via the circuit representation running independently of the spreadsheet program, into a set of output data; and sixth program instructions programmed to output the set of output data;

wherein:

the set of input data includes a first input data stream and the set of output data includes a first output data stream; and the formula language includes both typical combinatorial spreadsheet operators and operators for articulating well-specified timing semantics for relationships between and/or among cells.

4. The product of claim 3 wherein the timing semantics include support for: (i) rate-based rate manipulation, (ii) value-based rate manipulation, and (iii) access to past cell values.

5. A computer system comprising:

a processor(s) set; and a computer readable storage medium;

wherein:

the processor set is structured, located, connected and/or programmed to run program instructions stored on the computer readable storage medium; and the program instructions include:

first program instructions programmed to provide a computer-implemented spreadsheet program, second program instructions programmed to accept instructions from a user, through a formula language of the spreadsheet program, corresponding to transformations of data input into one or more input cells into data output into one or more output cells, third program instructions programmed to store the instructions as a circuit representation that can be used to perform the transformations of the input data into the output data independently of the spreadsheet program, fourth program instructions programmed to receive a set of input data, fifth program instructions programmed to transform the input data, via the circuit representation running independently of the spreadsheet program, into a set of output data, and sixth program instructions programmed to output the set of output data;

wherein:

the set of input data includes a first input data stream and the set of output data includes a first output data stream, and the formula language includes both typical combinatorial spreadsheet operators and operators for articulating well-specified timing semantics for relationships between and/or among cells.

6. The system of claim 5 wherein the timing semantics include support for: (i) rate-based rate manipulation, (ii) value-based rate manipulation, and (iii) access to past cell values.

* * * * *